(12) United States Patent
Lee et al.

(10) Patent No.: US 11,502,141 B2
(45) Date of Patent: Nov. 15, 2022

(54) INPUT SENSING DEVICE AND DISPLAY DEVICE HAVING THE SAME

(71) Applicant: Samsung Display Co., Ltd., Yongin-si (KR)

(72) Inventors: In Nam Lee, Yongin-si (KR); Jang Hui Kim, Yongin-si (KR); Choon Hyop Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/198,885

(22) Filed: Mar. 11, 2021

(65) Prior Publication Data
US 2021/0313401 A1  Oct. 7, 2021

(30) Foreign Application Priority Data

Apr. 2, 2020 (KR) .................. 10-2020-0040433

(51) Int. Cl.
*H01L 27/32* (2006.01)
*G06F 3/041* (2006.01)
*G06F 3/044* (2006.01)
*H01L 51/52* (2006.01)

(52) U.S. Cl.
CPC .......... *H01L 27/323* (2013.01); *G06F 3/0412* (2013.01); *G06F 3/0443* (2019.05); *G06F 3/04184* (2019.05); *H01L 51/5253* (2013.01); *G06F 2203/04112* (2013.01)

(58) Field of Classification Search
CPC ................. G06F 3/0446; G06F 3/0412; G06F 2203/04112; G06F 3/041–047; G06F 2203/041–04114
See application file for complete search history.

(56) References Cited

U.S. PATENT DOCUMENTS

| | | | |
|---|---|---|---|
| 8,780,074 | B2 | 7/2014 | Castillo et al. |
| 10,365,775 | B2 | 7/2019 | Sharma |
| 2011/0242050 | A1 | 10/2011 | Byun et al. |
| 2012/0268397 | A1 | 10/2012 | Lee et al. |
| 2017/0131823 | A1* | 5/2017 | Dinu ........................ G06F 3/044 |
| 2017/0205933 | A1 | 7/2017 | Kwon et al. |
| 2019/0103443 | A1* | 4/2019 | Kim ...................... G06F 3/0412 |

(Continued)

FOREIGN PATENT DOCUMENTS

| | | | | |
|---|---|---|---|---|
| CN | 110352398 A | * | 10/2019 | ....... G06F 3/041662 |
| KR | 20110112128 | | 10/2011 | |

(Continued)

*Primary Examiner* — Sanjiv D. Patel
(74) *Attorney, Agent, or Firm* — H.C. Park & Associates, PLC

(57) ABSTRACT

A display device including a display panel including pixels that emit light on a frame basis. An input sensing unit includes driving electrodes and sensing electrodes. A driving signal generator is configured to provide driving signals to the driving electrodes. Analog front-ends are configured to receive sensing signals depending on the driving signals from the sensing electrodes. A signal processor is configured to detect touch input, based on differential output values of the analog front-ends. The driving signal generator provides the driving signals to the driving electrodes while avoiding a period in which a pulse of a vertical synchronization signal defining start of the frame is generated.

24 Claims, 18 Drawing Sheets

(56) References Cited

U.S. PATENT DOCUMENTS

2019/0324572 A1\* 10/2019 Tan ................. G06F 3/044
2019/0339803 A1\* 11/2019 Park ................. G06F 3/044
2020/0285368 A1\* 9/2020 Yuan ................ G06F 3/04184

FOREIGN PATENT DOCUMENTS

| KR | 10-1093803 | 12/2011 |
| KR | 10-1239103 B1 | 3/2013 |
| KR | 2013-1239103 | 3/2013 |
| KR | 20170086752 | 7/2017 |
| KR | 20180104590 | 9/2018 |

\* cited by examiner

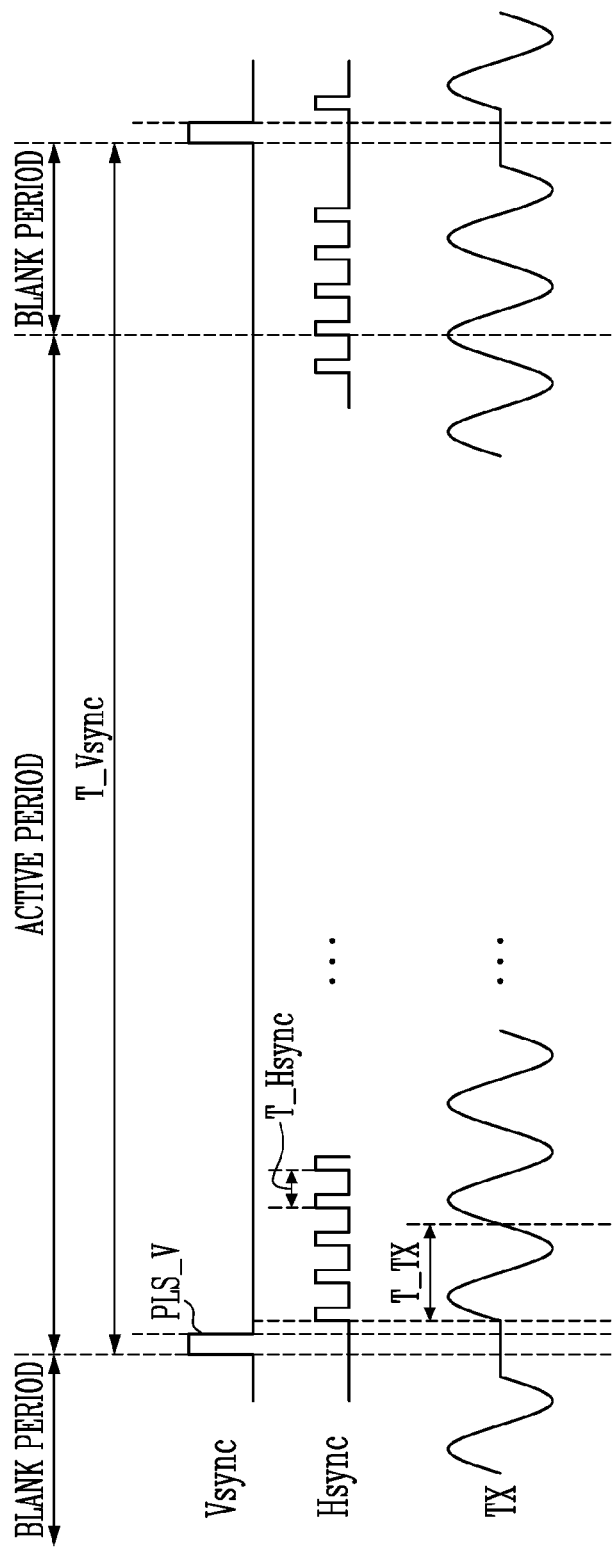

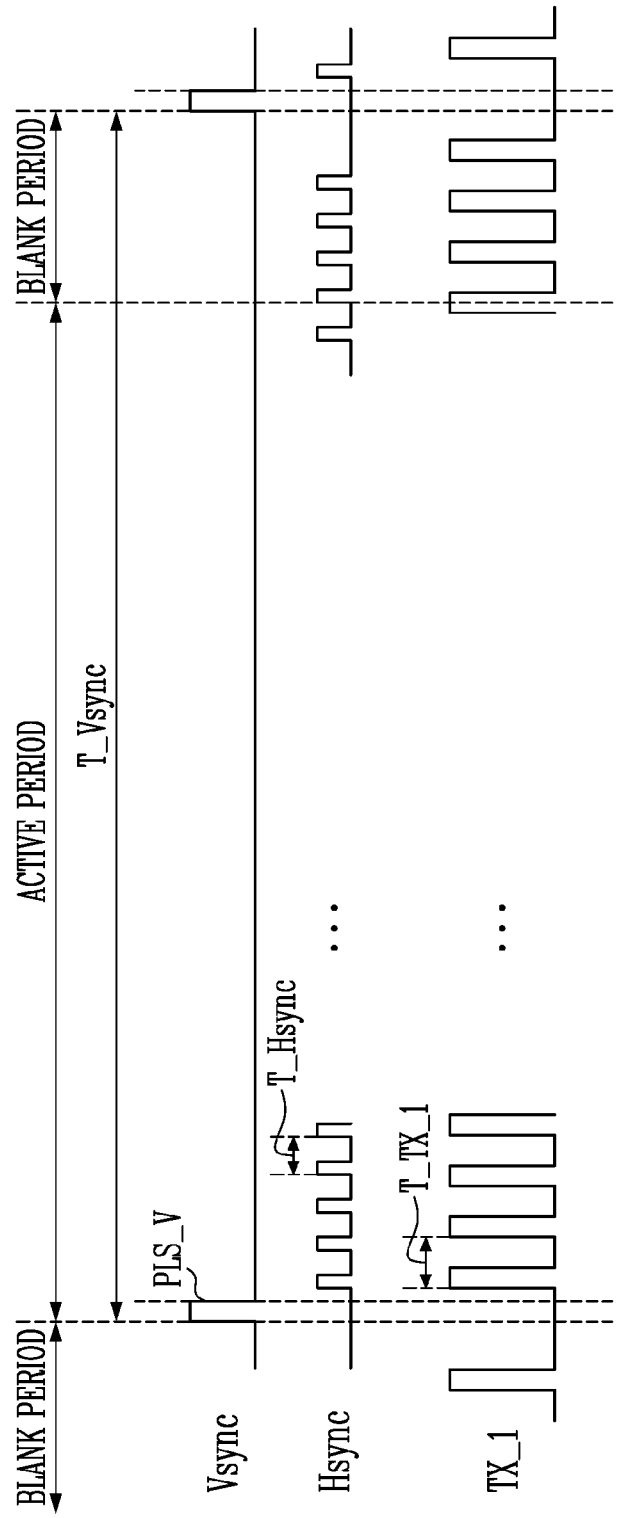

FIG. 12
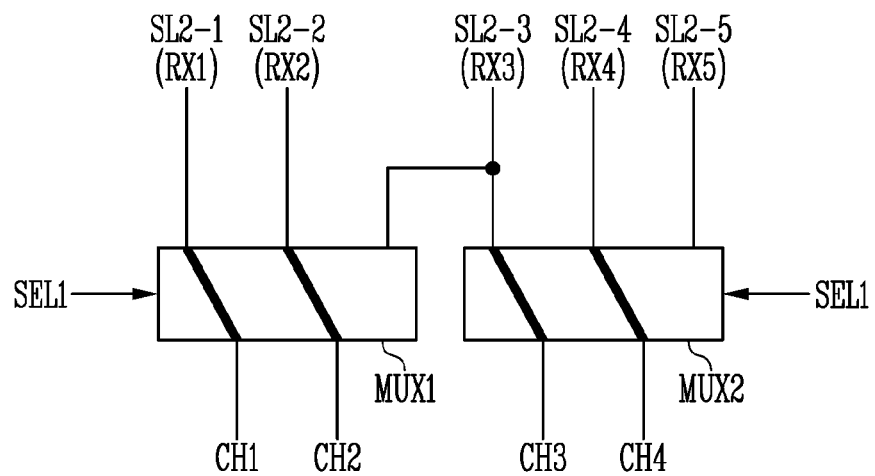
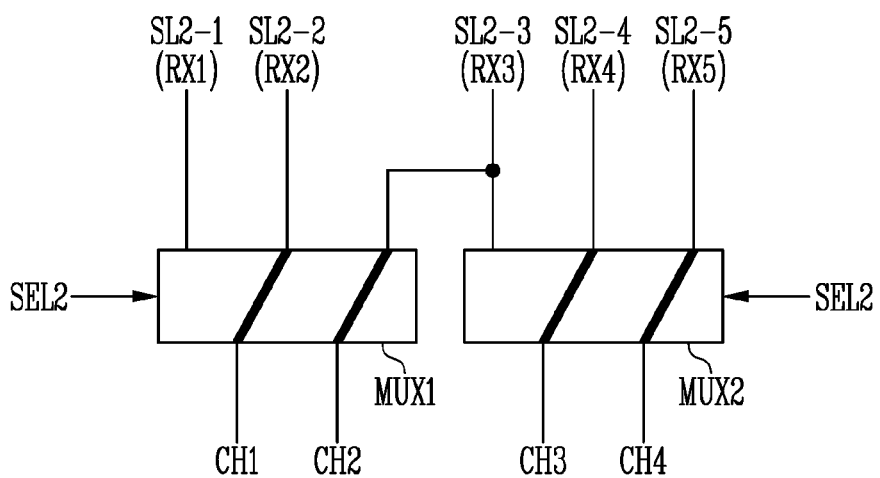

INPUT SENSING DEVICE AND DISPLAY DEVICE HAVING THE SAME

CROSS-REFERENCE TO RELATED APPLICATION

This application claims priority from and the benefit of Korean Patent Application No. 10-2020-0040433 filed on Apr. 2, 2020, which is hereby incorporated by reference for all purposes as if fully set forth herein.

BACKGROUND

Field

Exemplary embodiments of the invention relate generally to an input sensing device and a display device including the same.

Discussion of the Background

A display device may include a display panel that displays an image, and a touch panel that is disposed on the display panel to receive touch input.

The touch panel includes a plurality of sensing electrodes, and finds a touched point by sensing a change in capacitance formed on a plurality of touch electrodes.

Since a display driving signal for driving a display panel acts on a touch panel as noise, a touch driving signal for driving the touch panel is set to avoid the display driving signal (e.g. horizontal synchronization signal).

However, with the high-speed driving of the display device, the frequency of the display driving signal increases (e.g. driving speed increases from 60 Hz to 120 Hz), thereby reducing a period of the display driving signal. In response to the increase in frequency, the period of the touch driving signal may be reduced, and time for touch sensing may be reduced.

Furthermore, as display devices become thinner with increasingly larger screen sizes, a distance between the display panel and the touch panel (or touch electrodes) is reduced and an overlapping area between the display panel and the touch panel is increased, so that parasitic capacitance may be increased and touch sensing sensitivity may be degraded.

The above information disclosed in this Background section is only for understanding of the background of the inventive concepts, and, therefore, it may contain information that does not constitute prior art.

SUMMARY

Exemplary embodiments of the present invention are directed to an input sensing device having improved touch sensing sensitivity even in an environment (e.g. the high-speed driving, thinning, and enlargement of the display device) where the performance of a touch sensor is deteriorated, and a display device having the input sensing device.

Additional features of the inventive concepts will be set forth in the description which follows, and in part will be apparent from the description, or may be learned by practice of the inventive concepts.

An exemplary embodiment of the present invention provides a display device, including a display panel including pixels that emit light on a frame basis; an input sensing unit including driving electrodes and sensing electrodes; a driving signal generator configured to provide driving signals to the driving electrodes; analog front-ends configured to receive sensing signals depending on the driving signals from the sensing electrodes; and a signal processor configured to detect touch input, based on differential output values of the analog front-ends. The driving signal generator provides the driving signals to the driving electrodes while avoiding a period in which a pulse of a vertical synchronization signal defining start of the frame is generated.

The driving signal generator may stop supply of the driving signals, in the period in which the pulse of the vertical synchronization signal is generated.

The driving signals may be synchronized with the vertical synchronization signal, and the driving signal generator may simultaneously provide the driving signals to the driving electrodes.

Each of the driving signals may have a sine wave shape, and have a reference value in the period in which the pulse of the vertical synchronization signal is generated.

The driving signals may be asynchronous with a horizontal synchronization signal, the horizontal synchronization signal may define a period in which a line image is output through pixels included in a same line among the pixels, and a period in which each of the driving signals has the sine wave shape may overlap a period in which a pulse of the horizontal synchronization signal is generated.

A cycle of the driving signals may be different from a cycle of the horizontal synchronization signal.

The period in which each of the driving signals has the sine wave shape may overlap a blank period in which no data signal is provided to the pixels, within one frame.

A period in which each of the driving signals has the reference value may coincide with the period in which the pulse of the vertical synchronization signal is generated.

The driving signals may have a square wave shape of a same phase, and a period in which a pulse of the driving signals is generated may not overlap a period in which the pulse of the vertical synchronization signal is generated.

The period in which the pulse of the driving signals is generated may partially overlap a period in which a pulse of the horizontal synchronization signal is generated, and the horizontal synchronization signal may define the period in which the line image is output through the pixels included in the same line among the pixels.

Each of the analog front-ends may include a charge amplifier configured to output complementary first and second differential signals by differentially amplifying a first sensing signal and a second sensing signal that are provided from two adjacent sensing electrodes, respectively, among the sensing electrodes; a band pass filter configured to output a first filtered signal and a second filtered signal by filtering the first differential signal and the second differential signal, respectively; a mixer configured to output a first demodulated signal and a second demodulated signal by changing frequencies of the first filtered signal and the second filtered signal, respectively; a low pass filter configured to filter noise from each of the first demodulated signal and the second demodulated signal, thus outputting a first output signal and a second output signal; and an analog-to-digital converter configured to output a differential output value corresponding to a difference between the first output signal and the second output signal.

The charge amplifier may be embodied as a fully differential amplifier.

The charge amplifier may be configured to output the first differential signal through a first output terminal by differentially amplifying the first sensing signal applied through a first input terminal and the second sensing signal applied through a second input terminal, and to output the second differential signal having a waveform in which a phase of the first differential signal is reversed through a second output terminal.

The display device may further include a distribution circuit disposed between at least some of the sensing electrodes and the analog front-ends, respectively, and providing each of the sensing signals provided from at least some of the sensing electrodes to two adjacent analog front-ends among the analog front-ends.

The display device may further include a negative capacitor coupled to each of the analog front-ends.

Each of the analog front-ends may include a multiplexer configured to select two sensing signals among sensing signals provided from three adjacent sensing electrodes among the sensing electrodes; a charge amplifier configured to output complementary first and second differential signals by differentially amplifying the two sensing signals selected from the sensing signals; a band pass filter configured to output a first filtered signal and a second filtered signal by filtering the first differential signal and the second differential signal, respectively; a mixer configured to output a first demodulated signal and a second demodulated signal by changing frequencies of the first filtered signal and the second filtered signal, respectively; a low pass filter configured to output a first output signal and a second output signal by filtering noise from each of the first demodulated signal and the second demodulated signal; and an analog-to-digital converter configured to output a differential output value corresponding to a difference between the first output signal and the second output signal.

The multiplexer may select the first sensing signal and the second sensing signal among the sensing signals in a first period, and select the second sensing signal and a third sensing signal among the sensing signals in a second period different from the first period, and the first to third sensing signals may be provided from the three sensing electrodes, respectively.

Each of the analog front-ends may further include a negative capacitor coupled to each of input terminals of the multiplexer.

The display panel may include a base layer; a light-emitting element formed on the base layer to constitute each of the pixels; and a thin-film encapsulation layer configured to cover the light-emitting element, wherein the input sensing unit may be directly formed on the thin-film encapsulation layer.

The input sensing unit may include a first conductive layer formed on the thin-film encapsulation layer, and including a first pattern; an insulating layer disposed on the first conductive layer; and a second conductive layer disposed on the insulating layer, and including a second pattern, wherein at least one of the driving electrodes and the sensing electrodes may include the first pattern and the second pattern.

Each of the first pattern and the second pattern may have a mesh structure.

Another exemplary embodiment of the present invention may provide an input sensing device, including an input sensing unit including driving electrodes and sensing electrodes; a driving signal generator configured to provide driving signals to the driving electrodes; analog front-ends configured to receive sensing signals depending on the driving signals from the sensing electrodes; and a signal processor configured to detect touch input, based on differential output values of the analog front-ends. Each of the analog front-ends may generate complementary first and second differential signals by differentially amplifying a first sensing signal and a second sensing signal that are provided from two sensing electrodes of the sensing electrodes, extract a first output signal and a second output signal that correspond to the touch input from first and second differential signals, and provide the first output signal and the second output signal to an analog-to-digital converter.

Each of the analog front-ends may include a charge amplifier configured to output the first and second differential signals by differentially amplifying the first sensing signal and the second sensing signal, and the charge amplifier may be configured to output the first differential signal through a first output terminal by differentially amplifying the first sensing signal applied through a first input terminal and the second sensing signal applied through a second input terminal, and to output the second differential signal having a waveform in which the first differential signal is reversed through a second output terminal.

Each of the analog front-ends may further include a band pass filter configured to output a first filtered signal and a second filtered signal by filtering the first differential signal and the second differential signal, respectively; a mixer configured to output a first demodulated signal and a second demodulated signal by changing frequencies of the first filtered signal and the second filtered signal, respectively; and a low pass filter configured to output a first output signal and a second output signal by filtering noise from each of the first demodulated signal and the second demodulated signal.

Each of the analog front-ends may further include a multiplexer configured to select two sensing signals among sensing signals provided from three adjacent sensing electrodes among the sensing electrodes, and to provide the two selected sensing signals to the charge amplifier as the first sensing signal and the second sensing signal.

Each of the analog front-ends may further include a negative capacitor coupled to each of input terminals of the multiplexer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIGS. 7A to 7C are waveform diagrams illustrating an operation of a driving-signal generator included in the input sensing circuit of FIG. 6A.

FIG. 12 is a diagram illustrating an operation of a multiplexer included in the analog front-end of FIG. 11.

DETAILED DESCRIPTION

Figure 1:
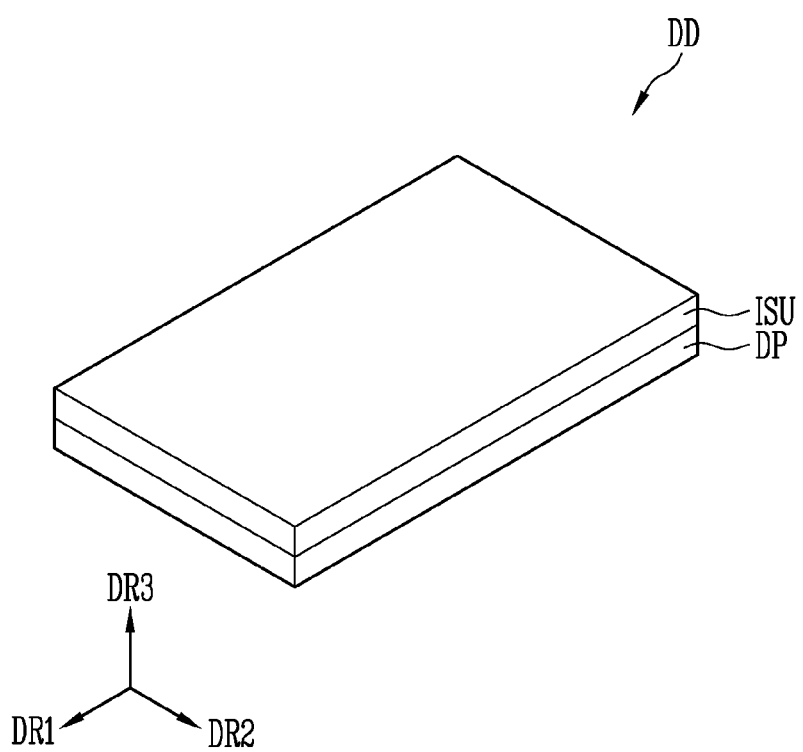
FIG. 1 is a perspective view illustrating a display device in accordance with embodiments of the present invention.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein may be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view illustrating a display device in accordance with embodiments of the present invention.

Referring to FIG. 1, the display device DD may be provided in various shapes, for example, the shape of a rectangular plate having two pairs of sides that are parallel to each other. When the display device DD has the shape of the rectangular plate, any one pair of sides may be longer than the remaining pair of sides.

The display device DD may display an image through a display surface. The display surface may be parallel to a surface defined by a first direction axis corresponding to a first direction DR1 and a second direction axis corresponding to a second direction DR2. A normal direction of the display surface, namely, a thickness direction of the display device DD, will be defined as a third direction DR3.

A front surface (or an upper surface) and a rear surface (or a lower surface) of each of members, layers, and units, which will be described herein below, may be defined in a third directional DR3. However, the first to third direction DR1, DR2, and DR3 are only for examples, and the first to third direction DR1, DR2, and DR3 are relative concepts and may be changed to other directions.

The display device DD may have a flat display surface. However, the inventive concepts are not limited to this. For example, the display device DD may include any one of various display surfaces capable of displaying an image, e.g., a curved display surface or a three-dimensional display surface. In the case where the display device DD in accordance with an embodiment of the present invention has a three-dimensional display surface, for example, the three-dimensional display surface may include a plurality of display areas oriented in respective different directions. The three-dimensional display surface may be embodied in the form of a polygonal-column-shaped display surface.

The display device DD may be a flexible display device. For example, the display device DD may be applied to a foldable display device, a bendable display device, a rollable display device, etc. The inventive concepts are not limited thereto, and the display device DD may be a rigid display device.

The display device DD may be applied to large-sized electronic devices, such as a television, a monitor, or an electronic display board, and small- and medium-sized electronic devices, such as a mobile phone, a tablet, a navigation device, a game console, or a smart watch. Furthermore, the display device DD may be applied to a wearable electronic device, such as a head-mount display.

The display device DD may include a display panel DP and an input sensing unit ISU (or input sensing layer).

The display panel DP and the input sensing unit ISU may be formed by a continuous process. However, the display panel DP and the input sensing unit ISU are not limited thereto. For example, the display panel DP and the input sensing unit ISU may be coupled to each other via an adhesive member. The adhesive member may contain common adhesive or glue. For example, the adhesive member may be an optical transparent adhesive member.

A corresponding component formed along with another component through a continuous process is expressed as a "layer", and a component coupled to another component through the adhesive member is expressed as a "panel". Although the "panel" may include a base layer, e.g., a synthetic resin film, a composite material film, or a glass substrate, for providing a base surface, the "layer" may be provided without a separate base layer. In other words, the input sensing unit ISU expressed as the "layer" may be disposed on the base surface provided by the display panel DP.

The input sensing unit ISU may sense contact with or input into the display surface of the display device DD by an external medium such as a hand or a pen.

The display panel DP may be a light emitting display panel. For example, the display panel DP may be an organic light-emitting display panel or a quantum dot light-emitting display panel.

In an embodiment, the display device DD may further include a reflection preventing panel or a window panel.

The reflection preventing panel is disposed on the input sensing unit ISU to reduce reflectance of external light that is incident on the display surface of the display device DD from the outside. For example, the reflection preventing panel may include color filters. The color filters may have a predetermined arrangement. The arrangement of the color filters may be determined in consideration of colors of emitted light of pixels included in the display panel DP.

A window panel may be disposed on the input sensing unit ISU to protect the display panel DP and the input sensing unit ISU from external shocks. The window panel may include a synthetic resin film and/or a glass substrate. The window panel may include two or more films coupled to each other by the adhesive member.

Figure 2:
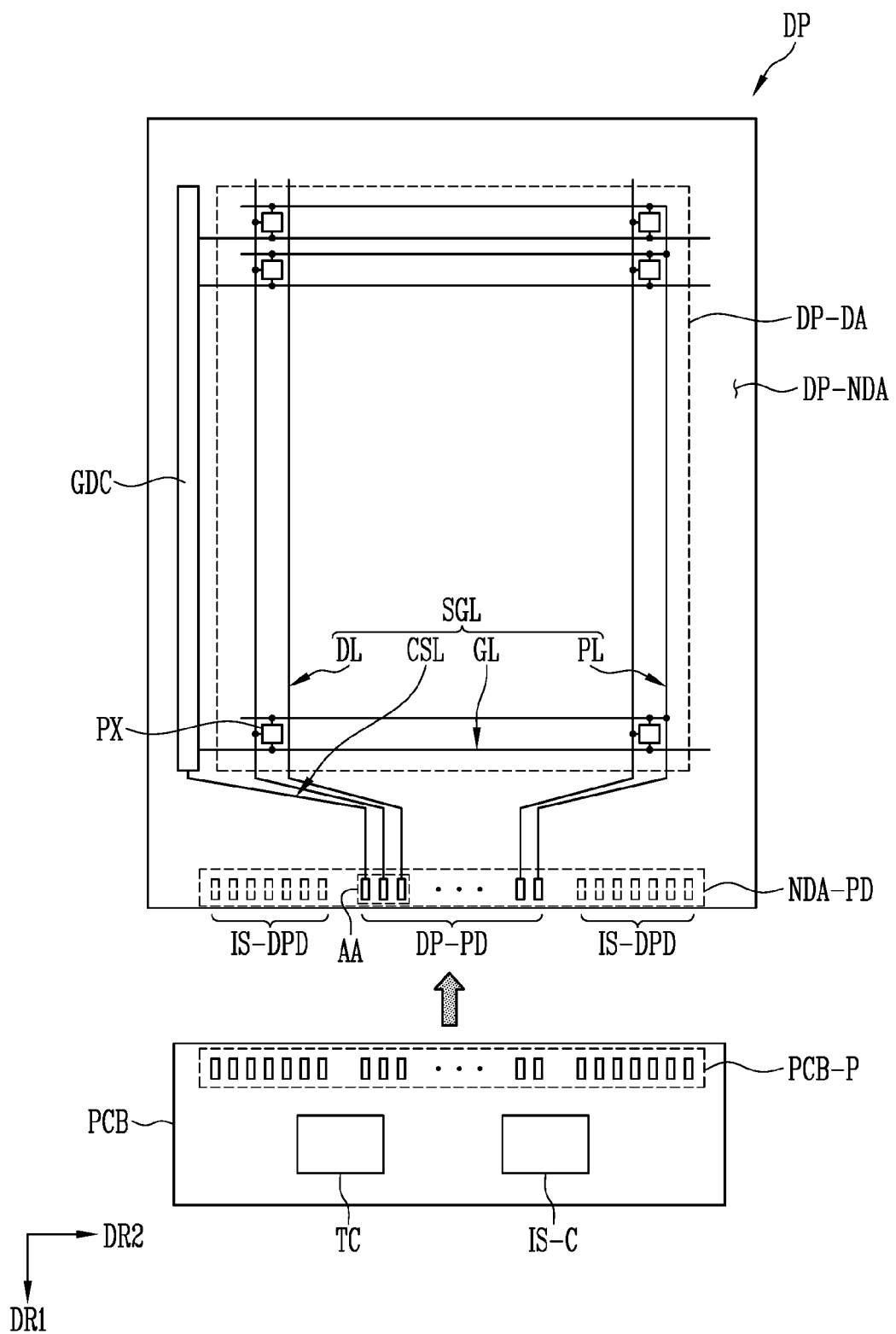
FIG. 2 is a plan view illustrating an example of a display panel included in the display device of FIG. 1.

FIG. 2 is a plan view illustrating an example of a display panel included in the display device of FIG. 1.

Referring to FIGS. 1 and 2, the display panel DP may include a display area DP-DA in which an image is displayed, and a non-display area DP-NDA adjacent to the display area DP-DA. The non-display area DP-NDA may be an area in which an image is not displayed. The non-display area DP-NDA may be disposed outside the display area DP-DA.

The display area DP-DA may include pixel areas each of which is provided with pixels PX. A pad part having pads of lines may be provided in the non-display area DP-NDA. A data driver (not shown) may be provided in the non-display area DP-NDA to provide a data signal to each of the pixels PX. The data driver may provide the data signal to each of the pixels PX through data lines. The data driver may be included in a timing control circuit TC that will be described later.

The display panel DP may include a driving circuit GDC, signal lines SGL, signal pads DP-PD, and pixels PX.

The pixels PX may be disposed in the display area DP-DA. Each of the pixels PX may include a light-emitting element, and a pixel driving circuit coupled to the light-emitting element. For example, the light-emitting element may be an organic light-emitting diode, but is not limited thereto.

The driving circuit GDC may include a scan driving circuit. The scan driving circuit may generate scan signals, and sequentially provide or output the scan signals to scan lines GL. The scan driving circuit may further provide another control signal to the pixel driving circuit of the pixels PX.

The scan driving circuit may include thin film transistors formed through the same process as that of the pixel driving circuit of each pixel PX, e.g., through a low temperature polycrystalline silicon (LTPS) process or a low temperature polycrystalline oxide (LTPO) process.

The signal lines SGL may include scan lines GL, data lines DL, a power line PL, and a control signal line CSL. Each of the scan lines GL may be coupled to a corresponding pixel among the pixels PX, and each of the data lines DL may be coupled to a corresponding pixel among the pixels PX. The power line PL may be coupled to the pixels PX. The control signal line CSL may provide control signals to the scan driving circuit.

The signal lines SGL may overlap the display area DP-DA and the non-display area DP-NDA. The signal lines SGL may include a pad part (or pad portion) and a line part (or line portion). The line part may overlap the display area DP-DA and the non-display area DP-NDA. The pad part may be coupled to an end of the line part. The pad part may be disposed in the non-display area DP-NDA and overlap a corresponding one of the signal pads DP-PD. In the non-display area DP-NDA, an area in which the signal pads DP-PD are disposed may be defined as a pad area NDA-PD.

The line part coupled to the pixels PX may form most of the signal lines SGL. The line part may be coupled to transistors of the pixels PX. The line part may have a single-layer or multilayer structure. The line part may be formed of a single body or a plurality of bodies. The plurality of bodies may be disposed on different layers and coupled to each other through a contact hole that passes through an insulating layer disposed between the plurality of bodies.

The display panel DP may further include dummy pads IS-DPD disposed in the pad area NDA-PD. The dummy pads IS-DPD may be formed through the same process as that of the signal lines SGL and, thus, disposed on the same layer as that of the signal lines SGL. The dummy pads IS-DPD may be selectively provided in the display device DD including the input sensing layer, and may be omitted in the display device DD including the input sensing panel.

FIG. 2 illustrates an additional printed circuit board PCB that is electrically coupled to the display panel DP. The printed circuit board PCB may be a flexible circuit board or a rigid circuit board. The printed circuit board PCB may be directly coupled to the display panel DP, or may be coupled to the display panel DP through another printed circuit board.

A timing control circuit TC configured to control the operation of the display panel DP may be disposed on the printed circuit board PCB. The timing control circuit TC may receive input image data and timing signals (e.g. vertical synchronization signal, horizontal synchronization signal, clock signals) from an external device (e.g. host system such as an application processor), generate a gate driving control signal for controlling the driving circuit GDC based on the timing signals, and provide the gate driving control signal to the driving circuit GDC. Of the timing signals, the vertical synchronization signal may define the start of one display period (or one frame) in which an image of one frame (or frame image) is displayed, or the start (or start of transmission) of image data corresponding to one frame. Meanwhile, of the timing signals, the horizontal synchronization signal may define a period in which each of images (e.g. image output through the pixels included in the same row) of the horizontal line included in the image of one frame is output. Furthermore, the timing control circuit TC may generate a data driving control signal for controlling the data driver, provide the data driving control signal to the data driver, and rearrange input image data to provide the rearranged data to the data driver.

Furthermore, an input sensing circuit IS-C configured to control the input sensing unit ISU may be disposed on the printed circuit board PCB. The input sensing circuit IS-C may receive the timing signal (e.g. vertical synchronization signal) from the external device (e.g. host system such as the application processor), and generate a touch driving signal (or driving signal) based on the vertical synchronization signal. Furthermore, the input sensing circuit IS-C may receive a sensing signal corresponding to touch input (e.g. a user's touch) from the input sensing unit ISU, and calculate or recognize the location of the touch input.

Each of the timing control circuit TC and the input sensing circuit IS-C may be mounted on the printed circuit board PCB in the form of an integrated chip. In an embodiment, the timing control circuit TC and the input sensing circuit IS-C may be mounted on the printed circuit board PCB in the form of a single integrated chip. The printed circuit board PCB may include circuit board pads PCB-P which are electrically coupled to the display panel DP. Although not shown in the drawings, the printed circuit board PCB may further include signal lines that couple the circuit board pads PCB-P with the timing control circuit TC and/or the input sensing circuit IS-C.

Figure 3:
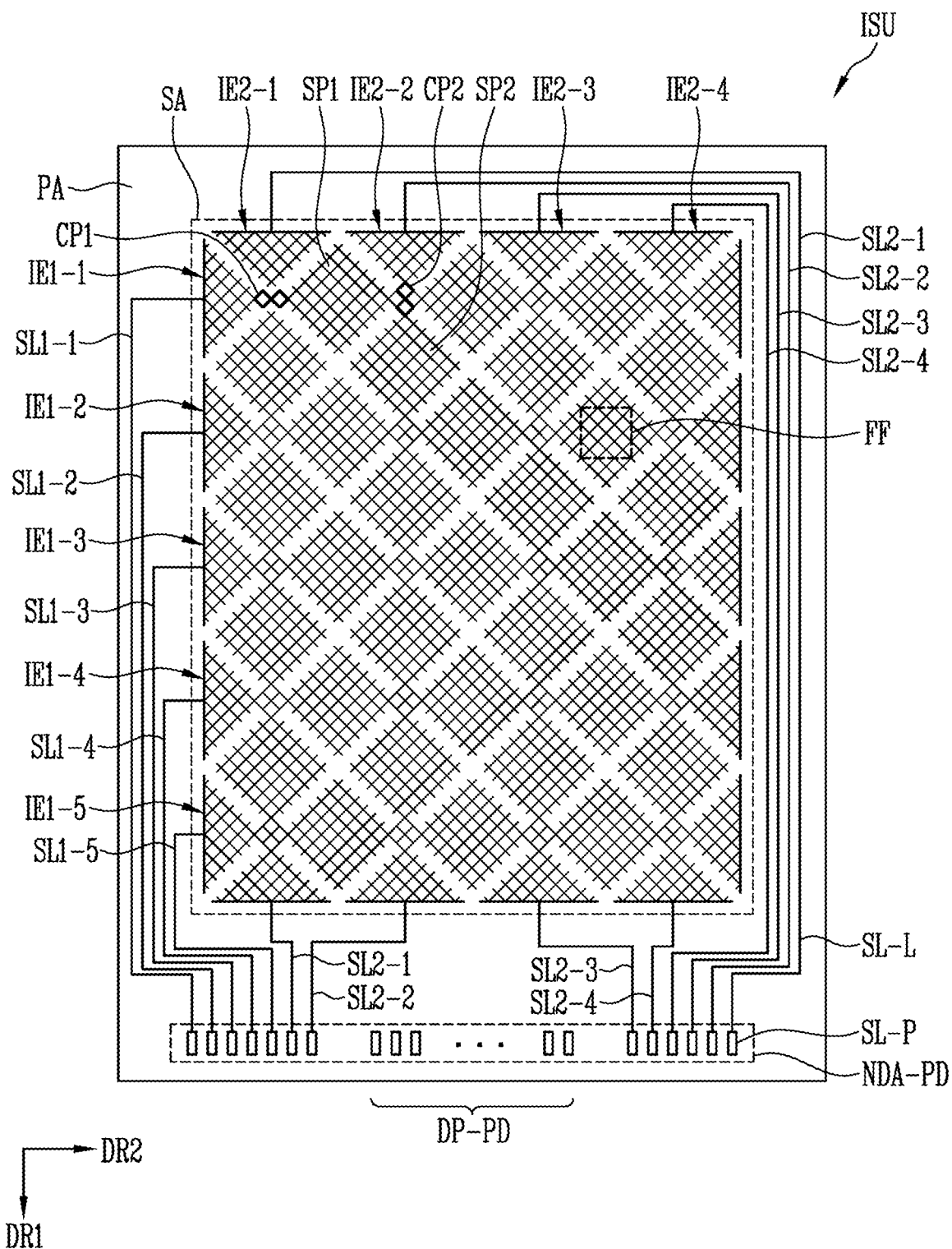
FIG. 3 is a plan view illustrating an example of an input sensing unit included in the display device of FIG. 1.
Figure 4:
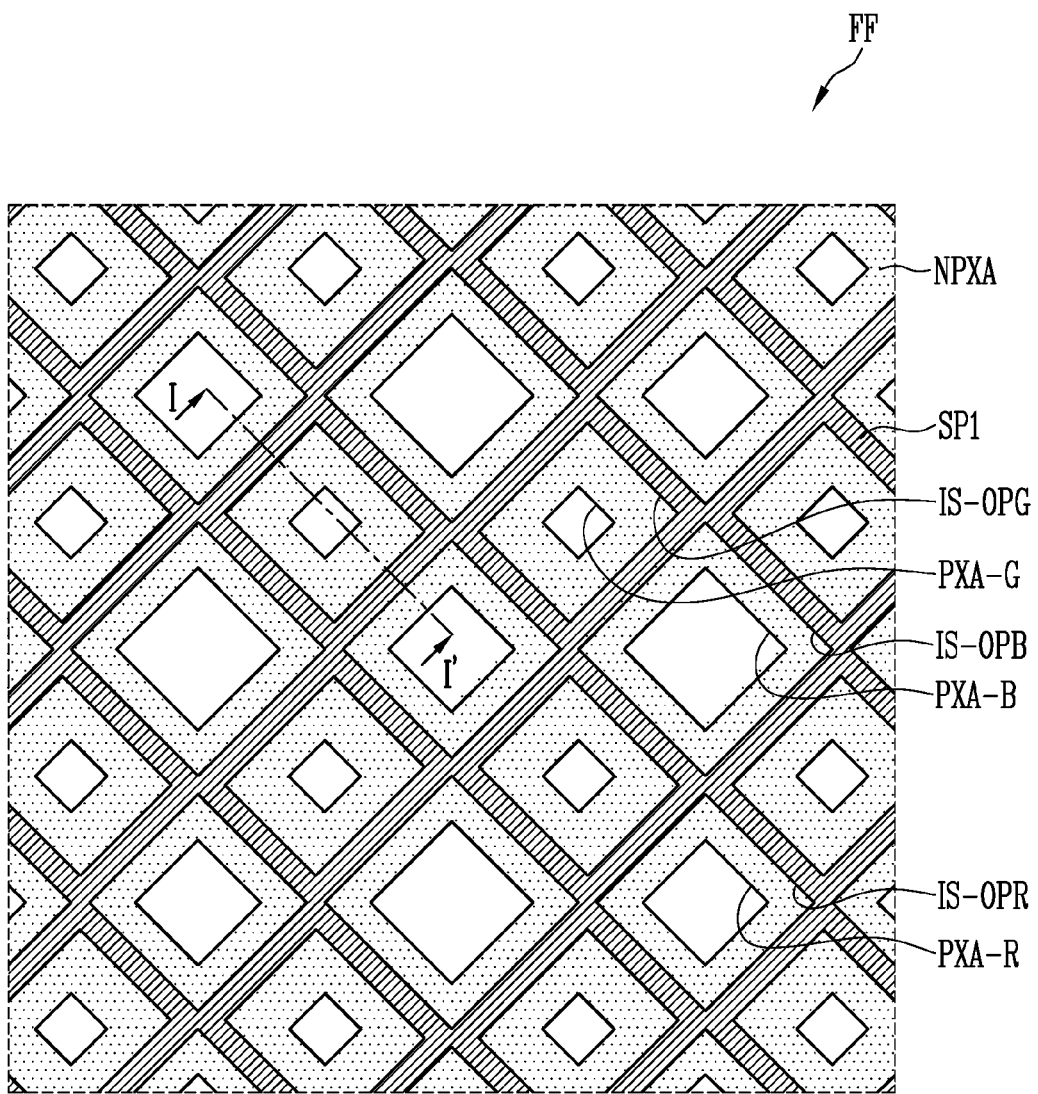
FIG. 4 is an enlarged plan view illustrating a first area of the input sensing unit of FIG. 3.

FIG. 3 is a plan view illustrating an example of an input sensing unit included in the display device of FIG. 1. FIG. 4 is an enlarged plan view illustrating a first area FF of the input sensing unit of FIG. 3.

Referring to FIGS. 2 and 3, the input sensing unit ISU may include a sensing area SA configured to sense a user's input, e.g., a touch and/or a pressure of the touch, of the user, and a peripheral area PA provided on at least one side of the sensing area SA.

The sensing area SA may correspond to the display area DP-DA of the display panel DP and have a surface area substantially equal to or greater than that of the display area DP-DA. The peripheral area PA may be disposed adjacent to the sensing area SA. Furthermore, the peripheral area PA may correspond to the non-display area DP-NDA of the display panel DP.

The input sensing unit ISU may include driving electrodes IE1-1 to IE1-5 and sensing electrodes IE2-1 to IE2-4 which are provided in the sensing area SA, and first signal lines SL1-1 to SL1-5 and second signal lines SL2-1 to SL2-4 which are provided in the peripheral area PA.

In each of the driving electrodes IE1-1 to IE1-5, the first sensors SP1 may be arranged in the second direction DR2. In each of the sensing electrodes IE2-1 to IE2-4, the second sensors SP2 may be arranged in the first direction DR1. Each of first connectors CP1 may couple the corresponding adjacent first sensors SP1 to each other. Each of second connectors CP2 may couple the corresponding adjacent second sensors SP2 to each other.

The driving IE1-1 to IE1-5 and the sensing electrodes IE2-1 to IE2-4 may have a mesh pattern or a mesh structure. As illustrated in FIG. 4, the mesh pattern may include mesh lines that are metal lines forming at least one mesh hole (or aperture) IS-OPR, IS-OPG, and IS-OPB. Each of the mesh holes IS-OPR, IS-OPG, and IS-OPB may have the shape of a diamond plane by the mesh lines, but the inventive concepts are not limited thereto.

Since each of the driving electrodes IE1-1 to IE1-5 and the sensing electrodes IE2-1 to IE2-4 has a mesh pattern, a parasitic capacitance between it and the electrodes of the display panel DP may be reduced.

Furthermore, as illustrated in FIG. 4, in the first area FF, the driving electrodes IE1-1 to IE1-5 and the sensing electrodes IE2-1 to IE2-4 may not overlap emission areas PXA-R, PXA-G, and PXA-B. Here, the emission areas PXA-R, PXA-G, and PXA-B may be included, respectively, in the pixels PX (or pixel areas in which the pixels PX are provided) described with reference to FIG. 2. Thus, the driving electrodes IE1-1 to IE1-5 and the sensing electrodes IE2-1 to IE2-4 may not be visually recognized by a user of the display device DD.

Each of the driving electrodes IE1-1 to IE1-5 and the sensing electrodes IE2-1 to IE2-4 may include aluminum, copper, chrome, nickel, titanium, and so forth. However, the inventive concepts are not limited thereto, and the touching electrodes and the sensing electrodes may be made of various metals.

For example, in the case where the driving electrodes IE1-1 to IE1-5 and the sensing electrodes IE2-1 to IE2-4 are formed of metal capable of using a low temperature process, the light-emitting element may be prevented from being damaged even when the input sensing unit ISU is formed through a continuous process after a process of manufacturing the display panel DP.

In the case where the driving electrodes IE1-1 to IE1-5 and the sensing electrodes IE2-1 to IE2-4 are directly formed in a mesh pattern on the display panel DP, the flexibility of the display device DD may be enhanced.

Although FIG. 3 illustrates that the driving electrodes IE1-1 to IE1-5 and the sensing electrodes IE2-1 to IE2-4 include the first sensors SP1 and the second sensors SP2 each having a diamond shape, the inventive concepts are not limited thereto. The first and second sensors SP1 and SP2 may have other polygonal shapes. Each of the driving electrodes IE1-1 to IE1-5 and the sensing electrodes IE2-1 to IE2-4 may have a shape (e.g., a bar shape) in which the sensors and the connectors are not distinct from each other.

The first signal lines SL1-1 to SL1-5 may be coupled to first ends of the respective driving electrodes IE1-1 to IE1-5. The second signal lines SL2-1 to SL2-4 may be coupled to both ends of the respective sensing electrodes IE2-1 to IE2-4. However, the inventive concepts are not limited thereto. For example, the first signal lines SL1-1 to SL1-5 may be coupled to both ends of the driving electrodes IE1-1 to IE1-5. In an embodiment, the second signal lines SL2-1 to SL2-4 may be coupled to only first ends of the respective sensing electrodes IE2-1 to IE2-4.

Because the sensing electrodes IE2-1 to IE2-4 are longer than the driving electrodes IE1-1 to IE1-5, the degree of voltage drop of a detection signal (or a transmitting signal) on the sensing electrodes IE2-1 to IE2-4 may be increased, whereby the sensing sensitivity may be reduced. Since the detection signal (or the transmitting signal) is provided through the second signal lines SL2-1 to SL2-4 coupled to both ends of the respective sensing electrodes IE2-1 to IE2-4, the voltage drop of the detection signal (or the transmitting signal) may be prevented, whereby the reduction in the sensing sensitivity may be prevented.

Each of the first and second signal lines SL1-1 to SL1-5 and SL2-1 to SL2-4 may include a line part SL-L and a pad part SL-P. The pad parts SL-P may be arranged in the pad area NDA-PD. The pad parts SL-P may overlap the dummy pads IS-DPD shown in FIG. 2.

The input sensing unit ISU may include signal pads DP-PD. The signal pads DP-PD may be arranged in the pad area NDA-PD.

Referring to FIG. 4, the first sensors SP1 may not overlap the emission areas PXA-R, PXA-G, and PXA-B but may overlap the non-emission area NPXA.

Mesh lines (metal lines) of the first sensors SP1 may define mesh holes IS-OPR, IS-OPG, and IS-OPB. The mesh holes IS-OPR, IS-OPG, and IS-OPB may form one-to-one correspondence with the emission areas PXA-R, PXA-G, and PXA-B. The emission areas PXA-R, PXA-G, and PXA-B may be exposed through the mesh holes IS-OPR, IS-OPG, and IS-OPB.

A width of each of the mesh lines may be less than a width of a pixel defining layer (i.e. pixel defining layer defining the emission areas PXA-R, PXA-G, and PXA-B) corresponding to the non-emission area NPXA.

Thus, it is possible to minimize the blocking of light emitted from the emission areas PXA-R, PXA-G, and PXA-B by the mesh lines, and to prevent the mesh lines from being visually recognized by a user.

Each of the mesh lines may form a three-layer structure having titanium/aluminum/titanium.

The emission areas PXA-R, PXA-G, and PXA-B may be classified into a plurality of groups according to the color of light generated from the light-emitting element. FIG. 4 illustrates an example in which the emission areas PXA-R, PXA-G, and PXA-B are classified into three groups according to the emission color.

The emission areas PXA-R, PXA-G, and PXA-B may have different areas according to the color of light emitted from the organic light-emitting diode. The surface area of each emission area PXA-R, PXA-G, PXA-B may be determined according to the kind of corresponding organic light-emitting diode.

The mesh holes IS-OPR, IS-OPG, IS-OPB may be classified into a plurality of groups having different surface areas. The mesh holes IS-OPR, IS-OPG, and IS-OPB may be classified into three groups according to the corresponding emission areas PXA-R, PXA-G, and PXA-B.

Although FIG. 4 illustrates that the mesh holes IS-OPR, IS-OPG, and IS-OPB one-to-one correspond to the emission areas PXA-R, PXA-G, and PXA-B, the inventive concepts are not limited thereto. For example, each of the mesh holes IS-OPR, IS-OPG, and IS-OPB may correspond to two or more emission areas PXA-R, PXA-G, or PXA-B.

Although FIG. 4 illustrates that the emission areas PXA-R, PXA-G, and PXA-B have various surface areas, this is merely illustrative and the inventive concepts are not limited thereto. For example, the emission areas PXA-R, PXA-G, and PXA-B may have the same size, and the mesh holes IS-OPR, IS-OPG, and IS-OPB may also have the same size. The plane shape of each of the mesh holes IS-OPR, IS-OPG, and IS-OPB may not limited, and it may have a diamond shape or other polygonal shapes. The plane shape of each of the mesh holes IS-OPR, IS-OPG, and IS-OPB may be a polygonal shape having rounded corners.

Although FIG. 3 illustrates that the input sensing unit ISU includes five driving electrodes IE1-1 to IE1-5 and four sensing electrodes IE2-1 to IE2-4, the numbers of the driving electrodes IE1-1 to IE1-5 and the sensing electrodes IE2-1 to IE2-4 are not limited thereto. For example, the input sensing unit ISU may include six or more driving electrodes and/or five or more sensing electrodes.

Figure 5:
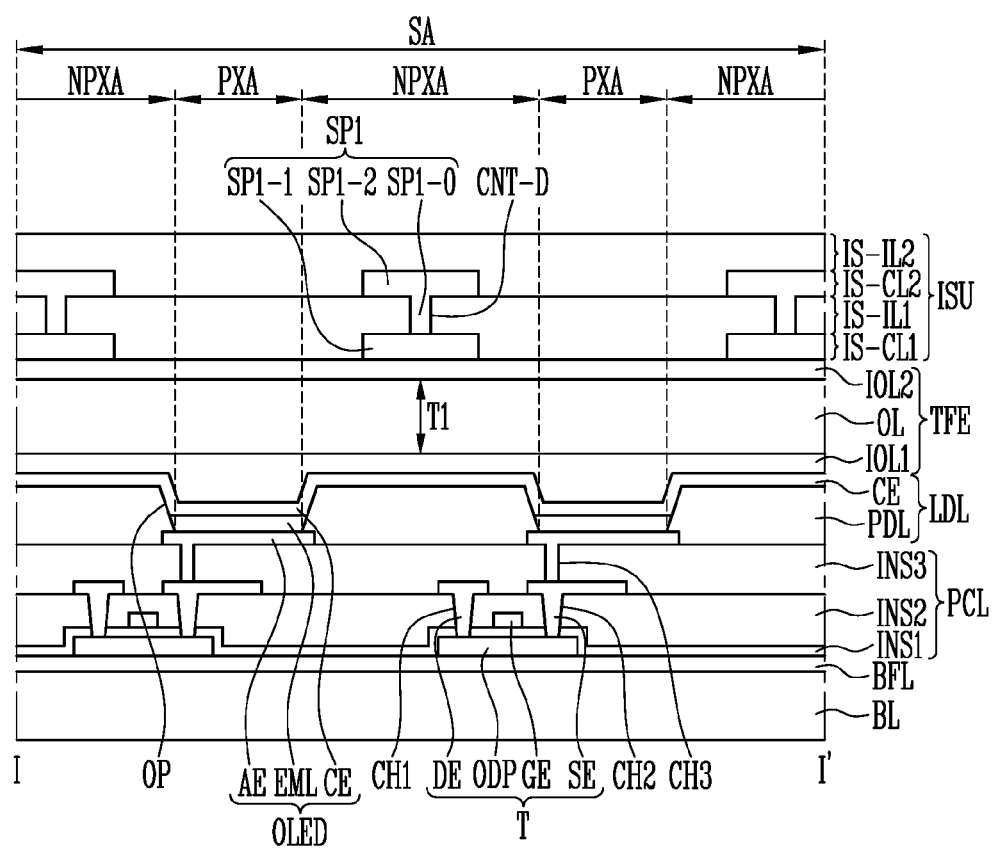
FIG. 5 is a sectional view illustrating an example of the display device, taken along line I-I' of FIG. 4.

FIG. 5 is a sectional view illustrating an example of the display device, taken along line I-I' of FIG. 4.

Referring to FIG. 5, the display device may include a base layer BL (or substrate), a buffer layer BFL, a pixel circuit layer PCL, a light-emitting element layer LDL, a thin-film encapsulation layer TFE, and an input sensing unit ISU.

The base layer BL may include a synthetic resin layer. The synthetic resin layer may be a polyimide-based resin layer, and the material thereof is not limited to a particular material. The base layer BL may include a glass substrate, a metal substrate, an organic/inorganic composite material substrate, or the like.

The buffer layer BFL may be provided on the base layer BL. The buffer layer BFL may prevent impurities from being diffused into a transistor T provided on the base layer BL, and enhance the flatness of the base layer BL. The buffer layer BFL may be provided in a single layer structure or a multilayer structure having at least two or more layers. The buffer layer BFL may be an inorganic insulating layer formed of inorganic material. For example, the buffer layer BFL may be formed of silicon nitride, silicon oxide, silicon oxynitride, or the like. In the case where the buffer layer BFL has the multilayer structure, the respective layers may be formed of the same material or different materials. In some cases, the buffer layer BFL may be omitted.

The pixel circuit layer PCL may include at least one insulating layer and a circuit element. The insulating layer may include at least one inorganic layer and at least one organic layer. The circuit element may include a signal line SGL (see FIG. 2), a pixel driving circuit of a pixel PX (see FIG. 2), etc.

A semiconductor pattern ODP of the transistor T may be disposed on the buffer layer BFL. The semiconductor pattern ODP may be selected from amorphous silicon, polysilicon, and metal oxide semiconductors.

A first insulating layer INS1 may be disposed on the semiconductor pattern ODP. The first insulating layer INS1 may be an inorganic insulating layer formed of inorganic material. For example, the first insulating layer INS1 may be formed of silicon nitride, silicon oxide, silicon oxynitride, or the like.

A control electrode GE of the transistor T may be disposed on the first insulating layer INS1. The control electrode GE may be manufactured by the same photolithography process as that of the scan lines GL (see FIG. 2).

A second insulating layer INS2 may be disposed on the first insulating layer INS1 to cover the control electrode GE. The second insulating layer INS2 may be an inorganic insulating layer formed of inorganic material. For example, the second insulating layer INS2 may be formed of silicon nitride, silicon oxide, silicon oxynitride, or the like.

A first transistor electrode DE (or drain electrode) of the transistor T and a second transistor electrode SE (or source electrode) may be disposed on the second insulating layer INS2.

The first transistor electrode DE and the second transistor electrode SE may be coupled to the semiconductor pattern ODP, respectively, through a first through-hole CH1 and a second through-hole CH2 that are formed through the first insulating layer INS1 and the second insulating layer INS2. Alternatively, the transistor T may be embodied in a bottom gate structure.

A third insulating layer INS3 may be disposed on the second insulating layer INS2 to cover the first transistor electrode DE and the second transistor electrode SE. The third insulating layer INS3 may provide a flat surface. The third insulating layer INS3 may be formed of an organic layer such as acryl resin, epoxy resin, phenolic resin, polyamide resin, or polyimide resin.

The light-emitting element layer LDL is disposed on the third insulating layer INS3. The light-emitting element layer LDL may include a pixel defining layer PDL and a light-emitting element OLED.

The pixel defining layer PDL may include organic material. A first electrode AE may be disposed on the third insulating layer INS3. The first electrode AE may be coupled to the second transistor electrode SE through a third through-hole CH3 that is formed through the third insulating layer INS3. The pixel defining layer PDL may include an opening OP, and the opening OP may define the emission areas PXA-R, PXA-G, and PXA-B. The opening OP of the pixel defining layer PDL may expose at least a portion of the first electrode AE. In a modification, the pixel defining layer PDL may be omitted.

The pixel PX (see FIG. 2) may be disposed in the display area DP-DA. The display area DP-DA may include an emission area PXA, and a non-emission area NPXA adjacent to the emission area PXA. The non-emission area NPXA may enclose the emission area PXA. The emission area PXA may be defined to correspond to the portion of the first electrode AE that is exposed through the opening OP. The non-emission area NPXA may be defined to correspond to the pixel defining layer PDL.

The light-emitting element OLED may include a first electrode AE coupled to the second transistor electrode SE, a light-emitting layer EML disposed on the first electrode AE, and a second electrode CE disposed on the light-emitting layer EML. For example, the light-emitting element OLED may be an organic light-emitting diode.

Any one of the first electrode AE and the second electrode CE may be an anode electrode, and the other one may be a cathode electrode. For example, the first electrode AE may be an anode electrode, and the second electrode CE may be a cathode electrode.

At least one of the first electrode AE and the second electrode CE may be a transmissive electrode. For example, in the case where a light-emitting element OLED is a back emitting type organic light-emitting element, the first electrode AE may be a transmissive electrode, and the second electrode CE may be a reflective electrode. In the case where the light-emitting element OLED is a front emitting type organic light-emitting element, the first electrode AE may be a reflective electrode, and the second electrode CE may be a transmissive electrode. In the case where the light-emitting element OLED is a both-side emitting type organic light-emitting element, both the first electrode AE and the second electrode CE may be transmissive electrodes. In the present embodiment, there is illustrated the case where the light-emitting element OLED is a front emitting type organic light-emitting element and the first electrode AE is an anode electrode.

In each pixel area, the first electrode AE may be disposed on the third insulating layer INS3. The first electrode AE may include a reflective layer which reflects light, and a transparent conductive layer which is disposed on or under the reflective layer. At least one of the transparent conductive layer and the reflective layer may be coupled with the second transistor electrode SE.

The reflective layer may include material that is able to reflect light. For example, the reflective layer may include at least one of aluminum (Al), silver (Ag), chrome (Cr), molybdenum (Mo), platinum (Pt), nickel (Ni) and an alloy thereof.

The transparent conductive layer may include transparent conductive oxide. For example, the transparent conductive layer may include at least one transparent conductive oxide of an indium tin oxide (ITO), an indium zinc oxide (IZO), an aluminum zinc oxide (AZO), a gallium doped zinc oxide (GZO), a zinc tin oxide (ZTO), a gallium tin oxide (GTO) and a fluorine doped tin oxide (FTO).

The light-emitting layer EML may be disposed on the exposed surface of the first electrode AE. The light-emitting layer EML may have a multilayer thin-film structure including at least a light generation layer (LGL). For instance, the light-emitting layer EML may include: a hole injection layer (HIL) into which holes are injected; a hole transport layer (HTL) which has excellent hole transportation performance and restrains movement of electrons that have not been coupled with holes in the light generation layer and thus increases chances of recombination between holes and electrons; the light generation layer which emits light by recombination between injected electrons and holes; a hole blocking layer (HBL) which restrains movement of holes that have not been coupled with electrons in the light generation layer; an electron transport layer (ETL) which is provided to smoothly transport electrons to the light generation layer; and an electron injection layer (EIL) into which electrons are injected.

The color of light generated from the light generation layer may be one of red, green, blue and white, but in the present embodiment, it is not limited thereto. For example, the color of light generated from the light generation layer of the light-emitting layer EML may be one of magenta, cyan, and yellow.

The hole injection layer, the hole transport layer, the hole blocking layer, the electron transport layer, and the electron injection layer may be common layers coupled between adjacent pixel areas.

The second electrode CE may be disposed on the light-emitting layer EML. The second electrode CE may be a semi-transmissive reflective layer. For example, the second electrode CE may be a thin metal layer having a thickness small enough to allow light to pass therethrough. The second electrode CE may allow some of the light generated from the light generation layer to pass therethrough and may reflect the rest of the light generated from the light generation layer.

The second electrode CE may include material having a work function lower than that of the transparent conductive layer. For instance, the second electrode CE may include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), and an alloy thereof.

Some of the light emitted from the light-emitting layer EML may not transmit through the second electrode CE, and light reflected by the second electrode CE is reflected by the reflective layer (not shown) again. That is, light emitted form the light-emitting layer EML may resonate between the reflective layer and the second electrode CE. The light extraction efficiency of the light-emitting element OLED may be enhanced by the resonance of light.

The distance between the reflective layer and the second electrode CE may change depending on the color of light generated from the light generation layer. That is, depending on the color of light generated from the light generation layer, the distance between the reflective layer and the second electrode CE may be adjusted to correspond to a resonance distance.

A thin film encapsulation layer TFE may be disposed on the second electrode CE. The thin film encapsulation layer TFE may be disposed in common in the pixels PX. The thin-film encapsulation layer TFE may directly cover the second electrode CE. In an embodiment, a capping layer suitable for covering the second electrode CE may be further disposed between the thin film encapsulation layer TFE and the second electrode CE. The thin film encapsulation layer TFE may directly cover the capping layer.

The thin film encapsulation layer TFE may include a first encapsulation inorganic layer IOL1, an encapsulation organic layer OL, and a second encapsulation inorganic layer IOL2, which are sequentially stacked on the second electrode CE. The encapsulation inorganic layers IOL1 and IOL2 may be formed of inorganic insulating material, such as silicon nitride, silicon oxide, or silicon oxynitride. The encapsulation organic layer OL may be formed of organic insulating material, such as a polyacryl-based compound, a polyimide-based compound, a fluorocarbon compound such as Teflon, or a benzocyclobutene compound.

The thickness T1 of the thin-film encapsulation layer TFE (or encapsulation organic layer OL) may be adjusted to prevent the input sensing unit ISU from being affected by noise generated by components of the light-emitting element layer LDL. As the display device becomes thinner, a thickness T1 of the thin film encapsulation layer TFE may be reduced (e.g., a thickness T1 of 10 µm or less), and noise generated by components of the light-emitting element layer LDL may affect the input sensing unit ISU.

The input sensing unit ISU may be provided on the thin film encapsulation layer TFE. The input sensing unit ISU may include a first conductive layer IS-CL1, a fourth insulating layer IS-ILL a second conductive layer IS-CL2, and a fifth insulating layer IS-IL2. Each of the first and second conductive layers IS-CL1 and IS-CL2 may have a single-layer structure or a multi-layer structure.

The conductive layer having a single-layer structure may include a metal layer or a transparent conductive layer. The metal layer may include molybdenum, silver, titanium, copper, aluminum, and an alloy of them. The transparent conductive layer may include transparent conductive oxide such as indium tin oxide (ITO), indium zinc oxide (IZO), zinc oxide (ZnO), or indium tin zinc oxide (ITZO). In addition, the transparent conductive layer may include a conducting polymer, such as PEDOT, a metal nanowire, graphene, etc.

The conductive layer having a multilayer structure may include multiple metal layers. For example, the multiple metal layers may have a three-layer structure having titanium/aluminum/titanium. The conductive layer having a multilayer structure may include at least one metal layer and at least one transparent conductive layer.

Each of the first and second conductive layers IS-CL1 and IS-CL2 may include a plurality of patterns. In the following embodiment, the first conductive layer IS-CL1 may include first conductive patterns and the second conductive layer IS-CL2 may include second conductive patterns. Each of the first conductive patterns and the second conductive patterns may include driving electrodes, sensing electrodes, and signal lines described with reference to FIG. 3.

Each of the fourth and fifth insulating layers IS-IL1 and IS-IL2 may have a single- or multi-layer structure. Each of the fourth and fifth insulating layers IS-IL1 and IS-IL2 may include inorganic material, organic material, or composite material.

At least one of the fourth and fifth insulating layers IS-IL1 and IS-IL2 may include an inorganic layer. The inorganic layer may include at least one of aluminum oxide, titanium oxide, silicon oxide, silicon oxynitride, zirconium oxide, and hafnium oxide.

At least one of the fourth and fifth insulating layers IS-IL1 and IS-IL2 may include an organic layer. The organic layer may include at least one of acrylic resin, methacrylic resin, polyisoprene, vinyl-based resin, epoxy-based resin, urethane-based resin, cellulose-based resin, siloxane-based resin, polyimide-based resin, polyamide-based resin, and perylene-based resin.

Referring to FIGS. 3 to 5, the first sensor SP1 of driving electrodes IE1-1 to IE1-5 may be formed of two mesh-shaped metal layers including a first mesh pattern SP1-1 and a second mesh pattern SP1-2. That is, the second mesh pattern SP1-2 may be located above the first mesh pattern SP1-1, and the fourth insulating layer IS-IL1 may be interposed between the second mesh pattern SP1-2 and the first mesh pattern SP1-1. A connecting contact hole CNT-D may be formed in the fourth insulating layer IS-IL1, and a contactor SP1-0 may be formed in the connecting contact hole CNT-D, thus electrically coupling the first mesh pattern SP1-1 with the second mesh pattern SP1-2. The contactor SP1-0 may be formed of conductive material. In an embodiment, the contactor SP1-0 may be formed of the same material as the first mesh pattern SP1-1 or the second mesh pattern SP1-2 for the convenience of process. In an embodiment, the contactor SP1-0 may be formed of material having higher electrical conductivity than that of the first mesh pattern SP1-1 or the second mesh pattern SP1-2.

A fifth insulating layer IS-IL2 may be formed on the second mesh pattern SP1-2. The fifth insulating layer IS-IL2 may entirely cover the second mesh pattern SP1-2, and may function as a planarization layer.

Similarly to the first sensor SP1 of the driving electrodes IE1-1 to IE1-5, the second sensor SP2 of the sensing electrodes IE2-1 to IE2-4 may have the mesh patterns of two layers. The mesh patterns of two layers may be disposed with the fourth insulating layer IS-IL1 interposed therebetween, and may be electrically coupled by the contactor through the connecting contact hole CNT-D formed in the fourth insulating layer IS-IL1.

The inventive concepts are not limited thereto. In an embodiment, the driving electrodes and the sensing electrode may have the mesh pattern of one layer.

Figure 6A:
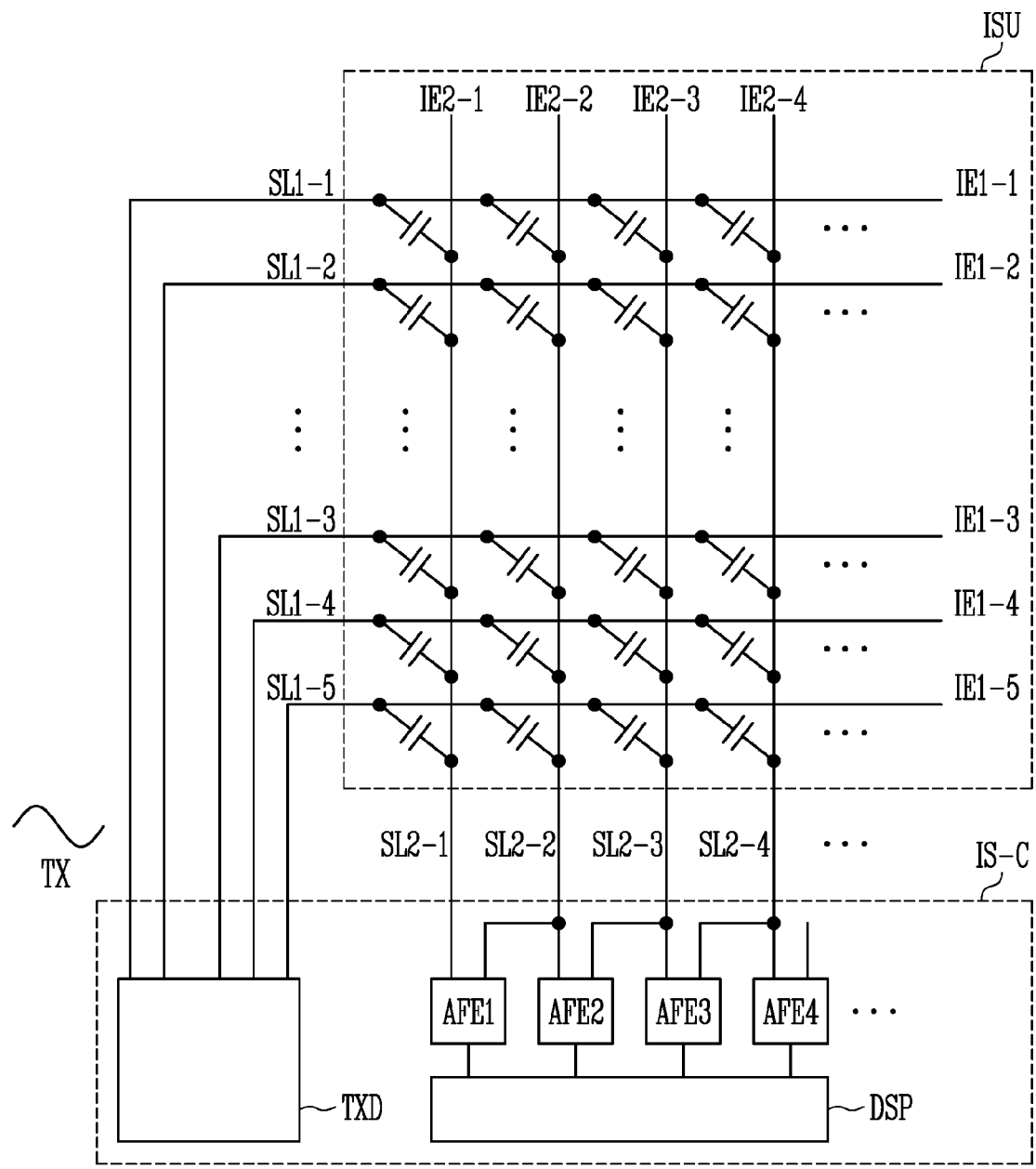
FIGS. 6A and 6B are circuit diagrams illustrating an example of an input sensing unit and an input sensing circuit included in the display device of FIG. 1.
Figure 6B:
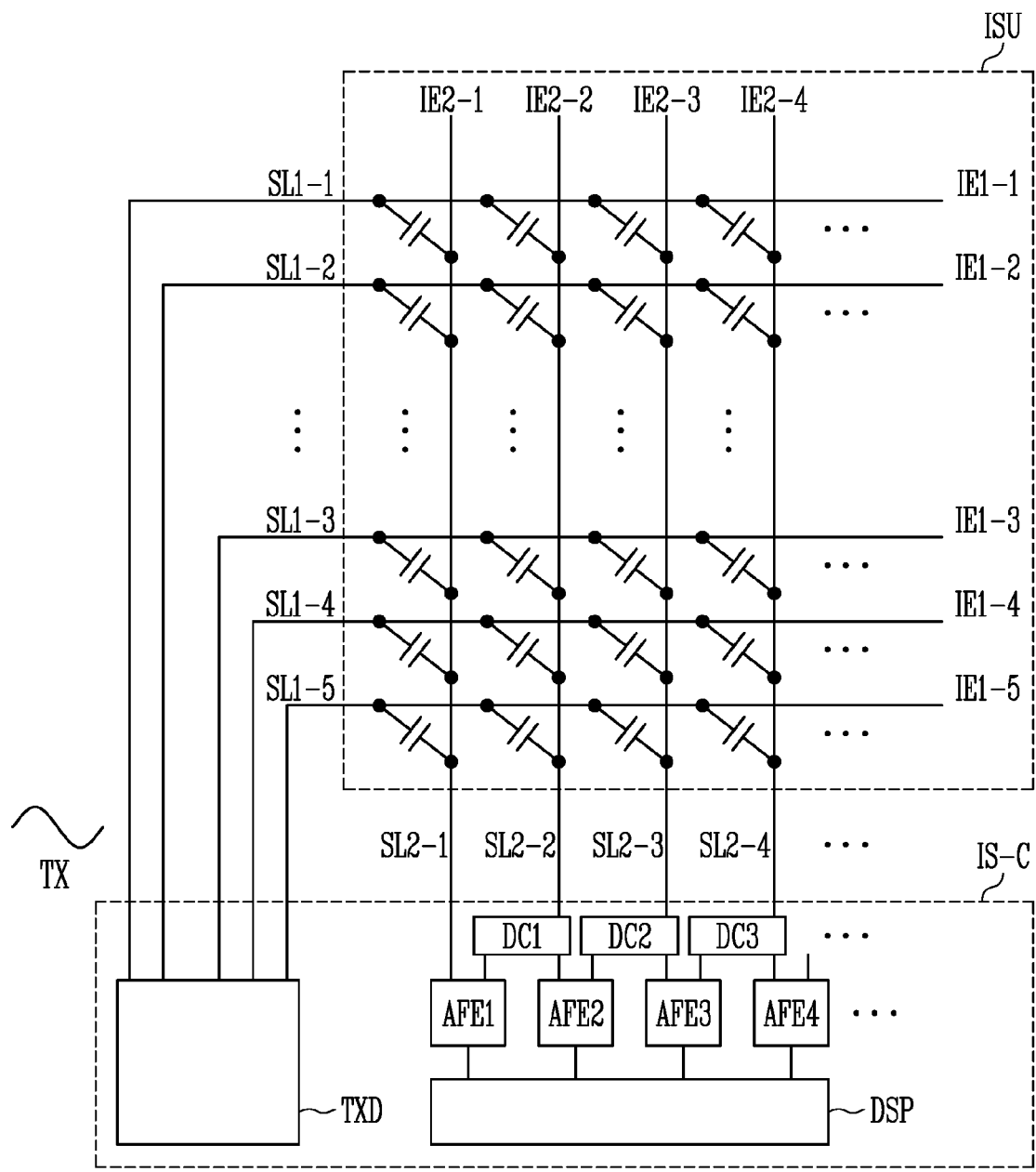

FIGS. 6A and 6B are circuit diagrams illustrating an example of an input sensing unit and an input sensing circuit included in the display device of FIG. 1. The input sensing unit and the input sensing circuit may constitute one input sensing device.

Referring to FIGS. 3, 6A, and 6B, since the driving electrodes IE1-1 to IE1-5, the sensing electrodes IE2-1 to IE2-4, the first signal lines SL1-1 to SL1-5, and the second signal lines SL2-1 to SL2-4 have been described with reference to FIG. 3, a duplicated description thereof will not be repeated therein.

The input sensing circuit IS-C may include a driving signal generator TXD, analog front-ends AFE1 to AFE4, and a signal processor DSP.

The driving signal generator TXD may generate a touch driving signal TX (or driving signal), and provide the touch driving signal TX to the driving electrodes IE1-1 to IE1-5. The touch driving signal TX may have AC voltage of a sine wave or a square wave. In an embodiment, the touch driving signal TX provided to the driving electrodes IE1-1 to IE1-5 may have the same waveform and phase, and be simultaneously provided to the driving electrodes IE1-1 to IE1-5. That is, the touch driving signal TX (or parallel driving signal) may be provided to the driving electrodes IE1-1 to IE1-5 in a parallel driving method.

In embodiments, the driving signal generator TXD may generate the touch driving signal TX synchronized with the vertical synchronization signal (i.e. as described above with reference to FIG. 2, the vertical synchronization signal provided from the application processor). For example, the driving signal generator TXD may avoid the pulse of the vertical synchronization signal to generate the touch driving signal TX, and may not provide the touch driving signal TX to the driving electrodes IE1-1 to IE1-5 (or block the supply of the touch driving signal TX) in a period when the vertical synchronization signal has a pulse, or may provide the touch driving signal TX of certain voltage (e.g. reference voltage). Here, the reference voltage may have a zero (0) level, a positive voltage level, or a negative voltage level, and the voltage level of the reference voltage is not limited particularly. The touch driving signal TX may be changed in a period between pulses of the vertical synchronization signal, and may have AC voltage, for example. Meanwhile, the touch driving signal TX may be asynchronous with the horizontal synchronization signal.

For reference, a cycle of the horizontal synchronization signal (i.e., as described above with reference to FIG. 2, the horizontal synchronization signal provided from the application processor) is relatively short, so that noise (e.g., specifically, high-frequency noise) caused by the horizontal synchronization signal may be effectively filtered through the analog front-ends AFE1 to AFE4. However, a cycle of the vertical synchronization signal is relatively long, so that noise (i.e., specifically, low-frequency noise) caused by the vertical synchronization signal may not be filtered through the analog front-ends AFE1 to AFE4. Thus, the driving signal generator TXD may generate the touch driving signal TX that is synchronized with the vertical synchronization signal, namely, avoids the pulse of the vertical synchronization signal, thus enhancing the touch sensing sensitivity.

In response to the touch driving signal TX provided to the driving electrodes IE1-1 to IE1-5, sensing capacitance may be formed between the driving electrodes IE1-1 to IE1-5 and the sensing electrodes IE2-1 to IE2-4. For example, 1-1-th sensing capacitance may be formed between a driving electrode IE1-1 located on a first place and a first sensing electrode IE2-1 located on a first place.

Each of the analog front-ends AFE1 to AFE4 may be coupled to two adjacent second sensing electrodes (or second signal lines) among the sensing electrodes IE2-1 to IE2-4, and output a sensing value (or differential output value) corresponding to a difference between the sensing capacitances. For example, the first analog front-end AFE1 may be coupled to a first sensing electrode IE2-1 located on the first place and a second sensing electrode IE2-2 located on a second place, and output a first sensing value corresponding to a difference between the sensing capacitance formed in the first sensing electrode IE2-1 located on the first place and the sensing capacitance formed in the second sensing electrode IE2-2 located on the second place. Likewise, the second analog front-end AFE2 may be coupled to a second sensing electrode IE2-2 located on the second place and a third sensing electrode IE2-3 located on a third place, and output a second sensing value corresponding to a difference between the sensing capacitance formed in the second sensing electrode IE2-2 located on the second place and the sensing capacitance formed in the third sensing electrode IE2-3 located on the third place.

When a touch event occurs in a specific area of the input sensing unit ISU, the sensing capacitance between the driving electrode and the sensing electrode located in a corresponding area may be changed. For example, when a touch event occurs in an area where the first driving electrode IE1-1 located on the first place and the first sensing electrode IE2-1 located on the first place intersect with each other, the level of the 1-1-th sensing capacitance between the first driving electrode IE1-1 and the first sensing electrode IE2-1 located on the first place may be varied. Meanwhile, the level of a 1-2-th sensing capacitance between the first driving electrode IE1-1 located on the first place and the second sensing electrode IE2-2 located on the second place, which is adjacent to the first sensing electrode IE2-1 located on the first place, may not be varied. Thus, the first sensing value output through the first analog front-end AFE1 may be varied, and a location where the touch occurs may be detected on the basis of a change in first sensing value.

Each of the analog front-ends AFE1 to AFE4 may include an amplifier, a filter, an analog-to-digital converter, etc. A detailed configuration of each of the analog front-ends AFE1 to AFE4 will be described later with reference to FIG. 8.

In embodiments, each of the analog front-ends AFE1 to AFE4 may be embodied in a fully differential analog front-end. For example, when the first analog front-end AFE1 includes a charge amplifier, a chopping circuit, filters, and an analog-to-digital converter that are sequentially coupled, the first analog front-end AFE1 may output two differential signals by differentially amplifying a first receiving signal corresponding to the sensing capacitance of the first sensing electrode IE2-1 located on the first place and a second receiving signal corresponding to the sensing capacitance of the second sensing electrode IE2-2 located on the second place using the charge amplifier, demodulate two differential signals using the chopping circuit and the filters, filter the two demodulated differential signals, and provide the two filtered differential signals to the analog-to-digital converter. In this case, the analog-to-digital converter may output the first sensing value based on the difference between the two filtered differential signals. In other words, the fully differential analog front-end may be an analog front-end that converts analog type of receiving signals provided from the sensing electrodes into a plurality of differential signals, maintains and outputs the signals, until it reaches a front end of the analog-to-digital converter (i.e. until the analog type of signal is converted into the digital type of signal). For reference, the charge amplifier and the filters include the amplifier, the voltage range of the charge amplifier and the filters in the low voltage system is limited, and the general analog front-end may not completely utilize the dynamic range of the analog-to-digital converter. Thus, the fully differential analog front-end may provide two differential signals to the analog-to-digital converter, thus increasing the dynamic range of the analog-to-digital converter or the available range of the dynamic range twofold, and enhancing the touch sensing sensitivity.

The sensing values output from the analog front-ends AFE1 to AFE4 may be provided to the signal processor DSP. The signal processor DSP may determine whether touch occurs or not on the basis of the sensing values, or may calculate a location where touch occurs.

In an embodiment, the input sensing unit ISU may further include distribution circuits DC1, DC2, and DC3.

As illustrated in FIG. 6B, the distribution circuits DC1, DC2, and DC3 may be disposed between at least some of the sensing electrodes IE2-1 to IE2-4 and the analog front-ends AFE1 to AFE4, generate a plurality of signals having the same intensity (e.g. the same voltage level, the same current amount) based on each of the sensing signals provided from at least some of the sensing electrodes IE2-1 to IE2-4, and distribute the generated signals to the analog front-ends AFE1 to AFE4. For example, the distribution circuits DC1, DC2, and DC3 may include an amplifier, a buffer, etc., and amplify or mirror each of the sensing signals to output the signal.

For example, the first distribution circuit DC1 may receive a second sensing signal provided from the second sensing electrode IE2-2 located on the second place, and provide signals that have the same intensity as the second sensing signal or are equal in intensity to each other to the first analog front-end AFE1 and the second analog front-end AFE2, respectively. For reference, when the second sensing signal does not pass through the first distribution circuit DC1, the second sensing signal is simultaneously supplied to the first analog front-end AFE1 and the second analog front-end AFE2. Due to a relative increase in load on the second sensing signal, the intensity (or maximum intensity, e.g. voltage level, current amount) of the second sensing signal may be different from the first sensing signal (i.e. the sensing signal provided from the first sensing electrode IE2-1 on the first place). Thus, the input sensing unit ISU may provide signals that have the same intensity as the second sensing signal or are equal in intensity to each other to the first analog front-end AFE1 and the second analog front-end AFE2, respectively, using the first distribution circuit DC1.

Likewise, the second distribution circuit DC2 may receive a third sensing signal provided from the third sensing electrode IE2-3 located on the third place, and provide signals that have the same intensity as the third sensing signal or are equal in intensity to each other to the second analog front-end AFE2 and the third analog front-end AFE3, respectively. The third distribution circuit DC3 may receive a fourth sensing signal provided from the fourth sensing electrode IE2-4 located on the fourth place, and provide signals that have the same intensity as the fourth sensing signal or are equal in intensity to each other to the third analog front-end AFE3 and the fourth analog front-end AFE4, respectively.

As described above with reference to FIGS. 6A and 6B, the input sensing circuit may differentially amplify adjacent sensing signals and remove noise (e.g. noise caused by the horizontal synchronization signal), using the fully differential analog front-end. Thus, the touch driving signal may be set regardless of the horizontal synchronization signal, and a reduction in bandwidth of the touch driving signal and deterioration in touch sensing sensitivity may be prevented.

Figure 7B:
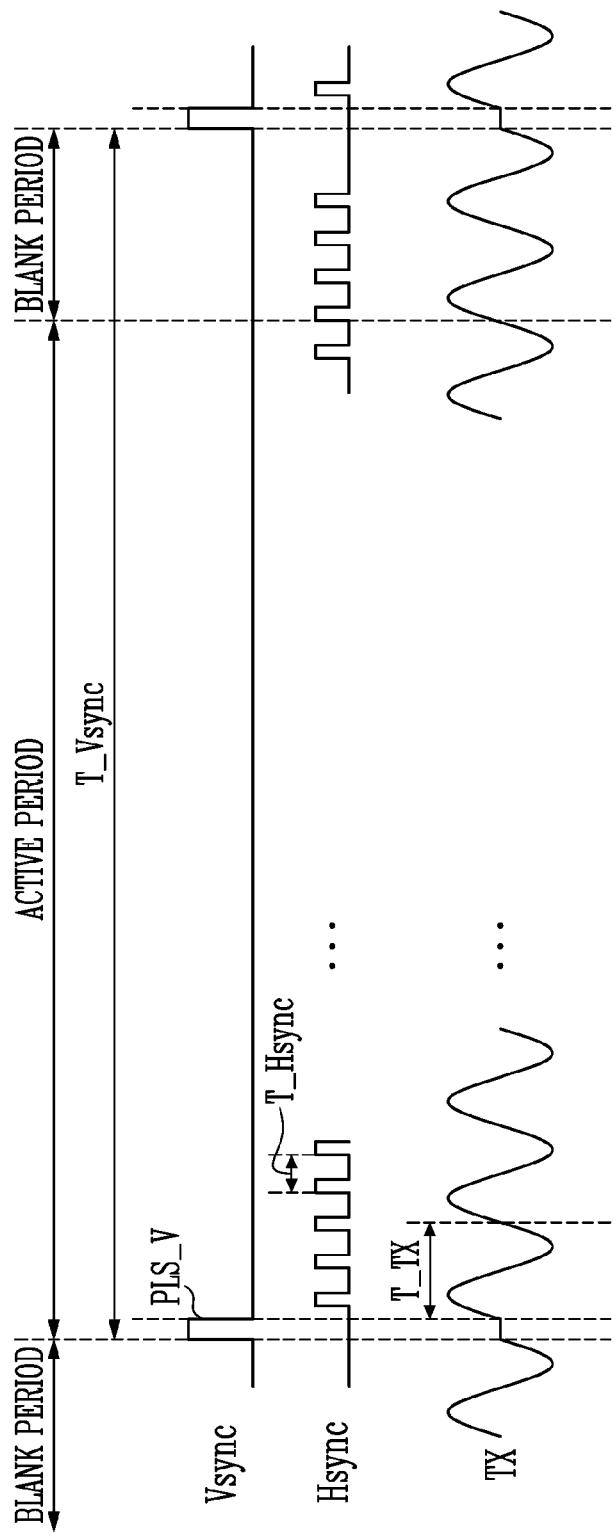

FIGS. 7A to 7C are waveform diagrams illustrating an operation of a driving-signal generator included in the input sensing circuit of FIG. 6A.

Referring to FIGS. 7A, 7B, and 7C, the vertical synchronization signal Vsync may be provided from an external device (e.g. host system such as the application processor) to the input sensing circuit IS-C and a timing control circuit TC (see FIG. 2), and define the start of one frame. One frame may include an active period (or display period) and a blank period. In the active period, a data signal may be sequentially recorded in the pixels PX described with reference to FIG. 2, and the pixels PX may emit light or display an image in response to the data signal. The blank period is a period taken after the active period in one frame is ended and before a subsequent frame (or subsequent active period) is started. In an embodiment, the display device may sense the light-emitting characteristics of the pixel in the blank period.

The horizontal synchronization signal Hsync may be provided from the external device (e.g. host system such as the application processor) to the timing control circuit TC, and not be provided to the input sensing circuit IS-C. The horizontal synchronization signal Hsync may define a period when each of images of the horizontal line included in the image of one frame is output.

When the display device is driven with the regeneration frequency of 60 Hz (or when the display device displays 60 frame images per second), the cycle T_Vsync of the vertical synchronization signal Vsync may be 16.67 ms (i.e. 1/60s). When the display device includes 2280 lines (or 3040 lines), the cycle T_Hsync of the horizontal synchronization signal Hsync may be 7.3 µs (or 5.5 µs).

When the display device is driven with the regeneration frequency of 120 Hz, the cycle T_Vsync of the vertical synchronization signal Vsync may be 8.33 ms. The cycle T_Hsync of the horizontal synchronization signal Hsync may be 3.7 µs (or 2.7 µs).

The touch driving signal TX may have a sine wave (or sine-wave type) shape or a square wave (or square-wave type) shape. As illustrated in FIG. 7A, the touch driving signal TX may have the sine wave shape.

In the period when the pulse PLS_V of the vertical synchronization signal Vsync is generated, the touch driving signal TX may have a reference value (or DC voltage). As described above with reference to FIG. 6A, the driving signal generator TXD may not output the touch driving signal TX or may output the touch driving signal TX having a specific value (e.g. 0V), in the period when the pulse PLS_V of the vertical synchronization signal Vsync is generated.

Just before a rising edge of the vertical synchronization signal Vsync is generated (or before the pulse PLS_V is generated), the touch driving signal TX has a reference value. After a falling edge of the vertical synchronization signal Vsync is generated (or after the pulse PLS_V is terminated), the touch driving signal TX may be changed into the sine wave shape.

The touch driving signal TX may be asynchronous with the horizontal synchronization signal Hsync. That is, the touch driving signal TX may overlap the horizontal synchronization signal Hsync. For example, in the period when the pulse of the horizontal synchronization signal Hsync is generated, the touch driving signal TX may be changed or have an AC value (or AC voltage). Furthermore, even in the period when the pulse of the horizontal synchronization signal Hsync is not generated, the touch driving signal TX may be changed. The touch driving signal TX may be changed regardless of the horizontal synchronization signal Hsync. For example, the cycle T_TX of the touch driving signal TX may be 5 µs, 4 µs, and 2.9 µs (or the touch driving signal TX may have the frequency of 200 KHz, 250 KHz, and 350 kHz), and may be different from 3.7 µs (or 2.7 µs) or a multiple thereof, which is the cycle T_Hsync of the horizontal synchronization signal Hsync. The frequency of the touch driving signal TX may be less than the frequency of the horizontal synchronization signal Hsync.

The touch driving signal TX may be changed or have the sine wave even in the blank period. Furthermore, the touch driving signal TX may have the sine wave shape even in the period when the pulse of the horizontal synchronization signal Hsync in the blank period is not generated.

As illustrated in FIG. 7A, the touch driving signal TX has the reference value before a predetermined time from a point when the rising edge of the vertical synchronization signal Vsync is generated, and the touch driving signal TX is changed into the sine wave shape after a predetermined time from a point when the falling edge of the vertical synchronization signal Vsync is generated. However, the touch driving signal TX is not limited thereto.

As illustrated in FIG. 7B, a period when the touch driving signal TX has the reference value may correspond to a period when the pulse PLS_V of the vertical synchronization signal Vsync is generated, a point when the touch driving signal TX starts to have the reference value may correspond to the rising edge of the vertical synchronization signal Vsync, and a point when the touch driving signal TX starts to have the AC value (or start point of the sine wave) may correspond to the falling edge of the vertical synchronization signal Vsync.

Furthermore, although it is illustrated in FIG. 7A that the touch driving signal TX has the sine wave shape, the touch driving signal TX is not limited thereto.

As illustrated in FIG. 7C, the touch driving signal TX_1 may have the square wave shape. A cycle T_TX_1 of the touch driving signal TX_1 may be equal to a cycle T_TX of the touch driving signal TX of FIG. 7A, and the pulse of the touch driving signal TX_1 may not be generated in the period when the vertical synchronization signal Vsync is generated. Meanwhile, the pulse of the touch driving signal TX_1 may partially overlap the pulse of the vertical synchronization signal Vsync.

As described above with reference to FIGS. 7A to 7C, the touch driving signal TX (and touch driving signal TX_1) may be synchronized with the vertical synchronization signal Vsync, have the AC value that avoids the pulse PLS_V of the vertical synchronization signal Vsync, and have the reference value in a period when the pulse PLS_V of the vertical synchronization signal Vsync is generated. Furthermore, the touch driving signal TX (and touch driving signal TX_1) may be asynchronous with the horizontal synchronization signal Hsync. Thus, the cycle T_TX (or cycle T_TX_1) of the touch driving signal TX (or touch driving signal TX_1) may be more freely set regardless of the horizontal synchronization signal Hsync, and a touch sensing time may be more sufficiently secured to correspond to the cycle T_TX of the touch driving signal TX.

Figure 8:
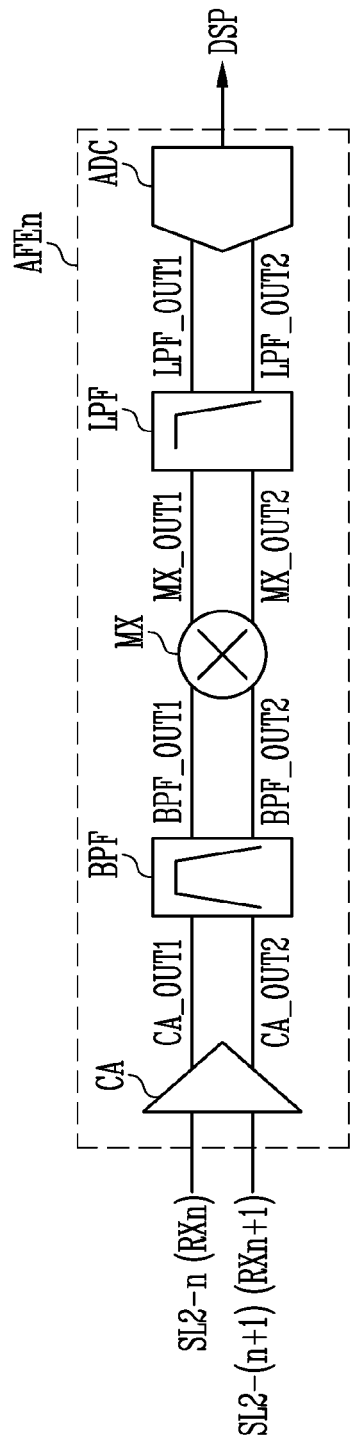
FIG. 8 is a block diagram illustrating an example of an analog front-end included in the input sensing circuit of FIG. 6A.
Figure 9A:
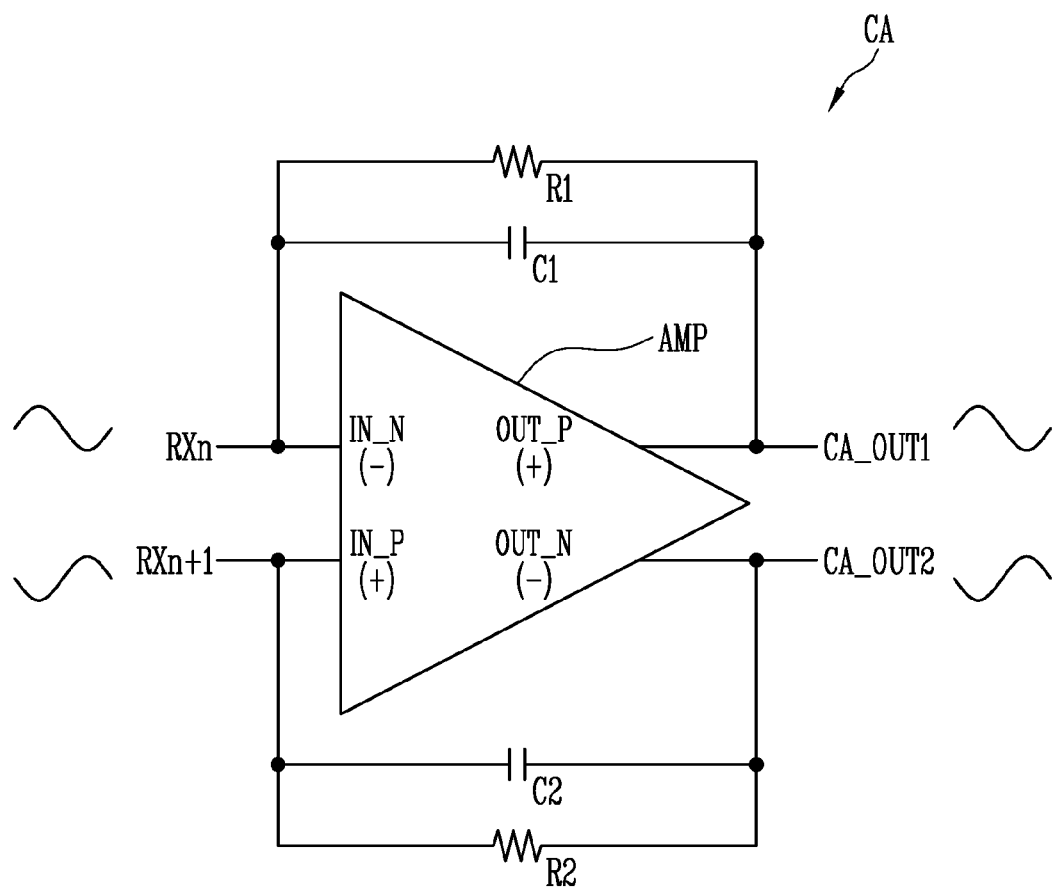
FIG. 9A is a circuit diagram illustrating an example of a charge amplifier included in the analog front-end of FIG. 8.
Figure 9B:
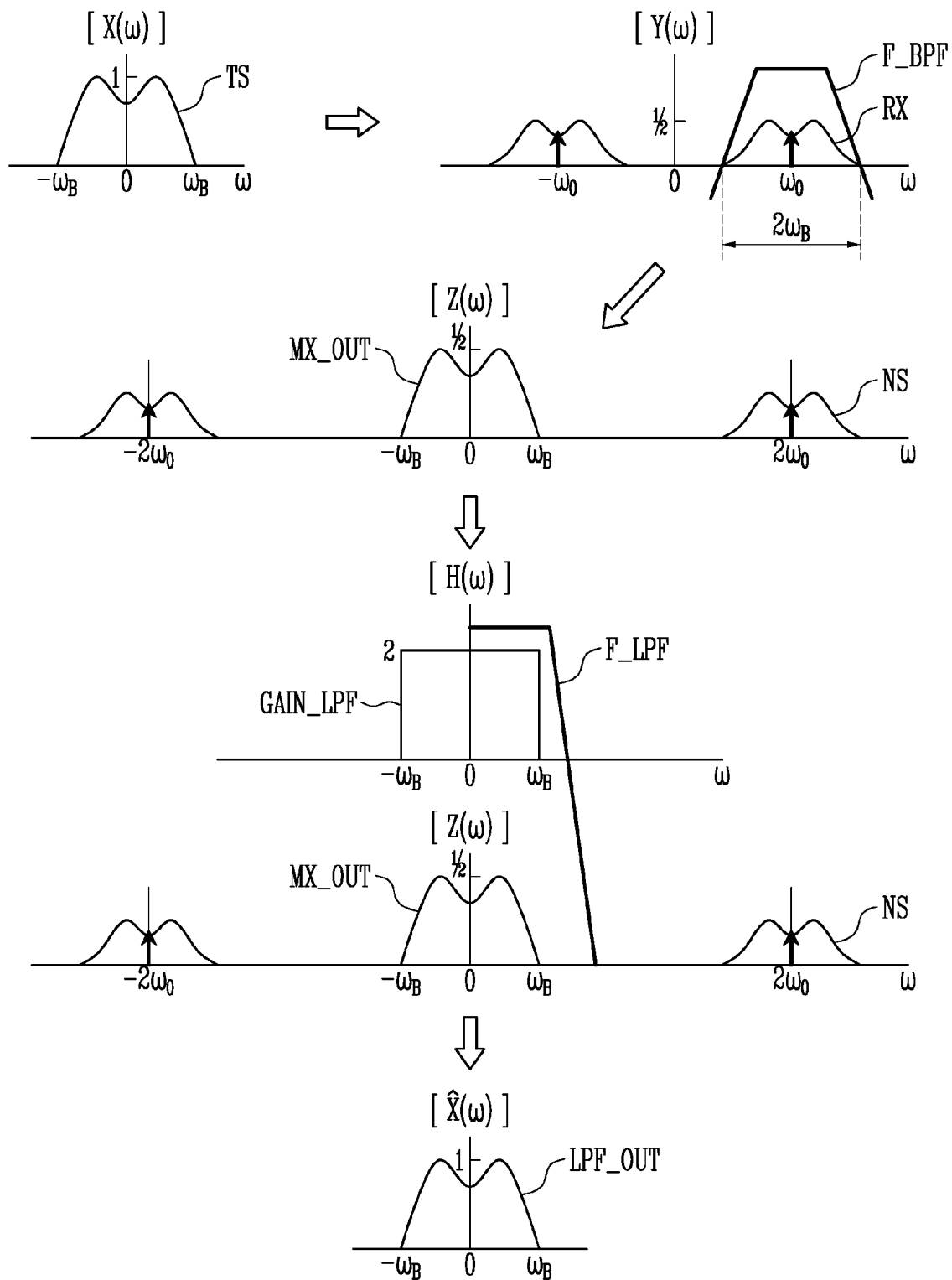
FIG. 9B is a diagram illustrating an example of signals illustrating an operation of the analog front-end of FIG. 8.

FIG. 8 is a block diagram illustrating an example of an analog front-end included in the input sensing circuit of FIG. 6A. FIG. 9A is a circuit diagram illustrating an example of a charge amplifier included in the analog front-end of FIG. 8. FIG. 9B is a diagram illustrating an example of signals illustrating an operation of the analog front-end of FIG. 8. FIG. 9B illustrates signals that are applied to the analog front-end of FIG. 8 or generated in the analog front-end in a frequency domain.

Referring to FIGS. 6A and 8, since the analog front-ends AFE1 to AFE4 are equal to each other, an analog front-end AFEn (n is a positive integer) as an example of the analog front-ends AFE1 to AFE4 will be collectively described.

The analog front-end AFEn may include a charge amplifier CA, a band pass filter BPF, a mixer MX, a low pass filter LPF, and an analog-to-digital converter ADC.

The charge amplifier CA may receive an n-th sensing signal RXn provided through a second signal line SL2-n located on an n-th place (or n-th sensing line), and an n+1-th sensing signal RXn+1 provided through a second signal line SL2-(n+1) located on an n+1-th place (or n+1-th sensing line), and differentially amplify the n-th sensing signal RXn and the n+1-th sensing signal RXn+1, thus outputting complementary first and second differential signals CA_OUT1 and CA_OUT2.

In embodiments, the charge amplifier CA may be embodied in the fully differential amplifier. A general differential amplifier may be defined as a differential amplifier that may differentiate two input signals and output one signal. The fully differential amplifier may be defined as a differential amplifier that may differentiate two input signals and output two signals (i.e. complementary signals). The charge amplifier CA embodied in the fully differential amplifier may maximize the intensity of the sensing signals, with respect to the analog-to-digital converter ADC (e.g. the differential analog-to-digital converter configured to differentiate two analog signals and output a digital value).

Referring to FIGS. 8 and 9A, the charge amplifier CA may include an amplifier AMP, a first capacitor C1, a first resistance R1, a second capacitor C2, and a second resistance R2.

The amplifier AMP may include a second input terminal IN_P (i.e., (+) input terminal), a first input terminal IN N (i.e., (−) input terminal), a first output terminal OUT_P (i.e., (+) output terminal), and a second output terminal OUT N (i.e., (−) output terminal). In some cases, the amplifier AMP may include a first sub-amplifier including input/output terminals corresponding to the second input terminal IN_P, the first input terminal IN N, and the first output terminal OUT_P, and a second sub-amplifier including input/output terminals corresponding to the second input terminal IN_P, the first input terminal IN N, and the second output terminal OUT N.

The first input terminal IN N of the amplifier AMP may be coupled to the second signal line SL2-n located on the n-th place, and the n-th sensing signal RXn may be applied to the first input terminal INN of the amplifier AMP. The second input terminal IN_P of the amplifier AMP may be coupled to the second signal line SL2-(n+1) located on the n+1-th place, and the n+l-th sensing signal RXn+1 may be applied to the second input terminal IN_P of the amplifier AMP.

The first capacitor C1 and the first resistance R1 may be coupled in parallel between the first input terminal IN N and the first output terminal OUT_P of the amplifier AMP. Thus, a first differential signal CA_OUT1 corresponding to difference between the n-th sensing signal RXn and the n+1-th sensing signal RXn+1 may be output through the first output terminal OUT_P of the amplifier AMP.

Likewise, the second capacitor C2 and the second resistance R2 may be coupled in parallel between the second input terminal IN_P and the second output terminal OUT N of the amplifier AMP. Thus, a second differential signal CA_OUT2 corresponding to a difference between the n+1-th sensing signal RXn+1 and the n-th sensing signal RXn may be output through the second output terminal OUT N of the amplifier AMP. The second differential signal CA_OUT2 may have a waveform in which the phase of the first differential signal CA_OUT1 is reversed.

The charge amplifier CA may eliminate AC offset and common noise, by outputting the first differential signal CA_OUT1 and the second differential signal CA_OUT2 in a differential method.

Referring back to FIG. 8, the band pass filter BPF may output a first filtered signal BPF_OUT1 and a second filtered signal BPF_OUT2, by selecting only a signal within a specific frequency band in each of the first differential signal CA_OUT1 and the second differential signal CA_OUT2.

Referring to FIG. 9B, the touch signal TS may have a frequency within a reference bandwidth (e.g. $-\omega_B$ to $\omega_B$) depending on the driving frequency (or sensing cycle) of the input sensing unit ISU (see FIG. 6). The sensing signal RX provided from the sensing electrodes IE2-1 to IE2-4 (see FIG. 6) to the analog front-end AFEn may be modulated by the touch driving signal TX, and have the frequency in a reference bandwidth $2\omega_0$ on the basis of the frequency $\omega_0$ of the touch driving signal TX. The sensing signal RX may include a negative frequency component (e.g. $-\omega_0$). The negative frequency component is equal in magnitude to a positive frequency component but has a phase difference of 180 degrees. Since the negative frequency component has no physical meaning, this is not considered. The band pass filter BPF may have a first transfer function F_BPF corresponding to the frequency band of the sensing signal RX, and amplify only a signal in a corresponding frequency band. For example, the band pass filter BPF may include the differential amplifier (or fully differential amplifier), the capacitor, and the resistance, and amplify only the signal corresponding to the frequency band (e.g. 200 KHz to 350 KHz) of the touch driving signal TX (see FIG. 7A).

Referring back to FIG. 8, the band pass filter BPF may selectively amplify the first differential signal CA_OUT1 to output the first filtered signal BPF_OUT1, and selectively amplify the second differential signal CA_OUT2 to output the second filtered signal BPF_OUT2. For example, the band pass filter BPF may selectively amplify the first differential signal CA_OUT1 applied to a negative input terminal of the fully differential amplifier to output the first filtered signal BPF_OUT1 through a positive output terminal of the fully differential amplifier, and may selectively amplify the second differential signal CA_OUT2 applied to a positive input terminal of the fully differential amplifier to output the second filtered signal BPF_OUT2 through a negative output terminal of the fully differential amplifier.

The second filtered signal BPF_OUT2 may have a waveform in which a phase of the first filtered signal BPF_OUT1 is reversed.

The mixer MX may change the frequency of each of the first filtered signal BPF_OUT1 and the second filtered signal BPF_OUT2 to output a first demodulated signal MX_OUT1 and a second demodulated signal MX_OUT2. For example, the mixer MX may demodulate the first filtered signal BPF_OUT1 to output the first demodulated signal MX_OUT1, and demodulate the second filtered signal BPF_OUT2 to output the second demodulated signal MX_OUT2.

For example, the mixer MX may be embodied as a chopping circuit (or chopper) including two input terminals and two output terminals, and alternately couple the first filtered signal BPF_OUT1 and the second filtered signal BPF_OUT2, provided to the two input terminals, to two output terminals to generate a first demodulated signal MX_OUT1 and a second demodulated signal MX_OUT2. In other words, the mixer MX may extract the touch signal TS (see FIG. 9B) from the first filtered signal BPF_OUT1 and the second filtered signal BPF_OUT2.

Referring to FIG. 9B, the mixer MX may convert a signal in the relatively high-frequency band (i.e. signal in the frequency band corresponding to the band pass filter BPF) into a demodulated signal MX_OUT in the low-frequency band (i.e. signal in the frequency band corresponding to the touch signal TS). Furthermore, the mixer MX may convert noise in the relatively low-frequency band into high frequency noise NS in the high-frequency band. For reference, the low frequency noise (e.g. noise called "1/f noise") generally occurs in semiconductor elements (e.g. transistor) forming the analog front-end AFEn, and the mixer MX may transfer the low-frequency noise to the high-frequency band through a chopping operation.

Referring back to FIG. 8, the low pass filter LPF may filter noise distributed in the high-frequency band of each of the first demodulated signal MX_OUT1 and the second demodulated signal MX_OUT2 to output a first output signal LPF_OUT1 (or third filtered signal) and a second output signal LPF_OUT2 (or fourth filtered signal).

For example, the low pass filter LPF may include a differential amplifier (or fully differential amplifier), a resistance, and a capacitor, and amplify only the signal of the relatively low-frequency band. The low pass filter LPF may filter the noise of the first demodulated signal MX_OUT1 to output the first output signal LPF_OUT1, and filter the noise of the second demodulated signal MX_OUT2 to output the second output signal LPF_OUT2. For example, the low pass filter LPF may filter the noise of the first demodulated signal MX_OUT1 applied to the negative input terminal of the fully differential amplifier to output the first output signal LPF_OUT1 through the positive output terminal of the fully differential amplifier, and filter the noise of the second demodulated signal MX_OUT2 applied to the positive input terminal of the fully differential amplifier to output the second output signal LPF_OUT2 through the negative output terminal of the fully differential amplifier. The second output signal LPF_OUT2 may have a polarity different from that of the first output signal LPF_OUT1.

Referring to FIG. 9B, the low pass filter LPF may have a second transfer function F_LPF corresponding to the frequency band of the touch signal TS. For example, a gain GAIN LPF of the second transfer function F_LPF may be about 2 in the frequency band of $\omega_B$ or less. In this case, the low pass filter LPF may amplify only the demodulated signal MX_OUT in the low frequency band to output it as the output signal LPF_OUT.

As described above, the band pass filter BPF, the mixer MX, and the low pass filter LPF function as a demodulator to recover or extract only signals (i.e. the first output signal LPF_OUT1 and the second output signal LPF_OUT2) corresponding to the touch driving signal TX from the n-th sensing signal RXn and the n+1-th sensing signal RXn+1.

The analog-to-digital converter ADC may receive the first output signal LPF_OUT1 and the second output signal LPF_OUT2, and provide the sensing value (or differential output value) corresponding to a difference (e.g. |LPF_OUT1−LPF_OUT2|) between the first output signal LPF_OUT1 and the second output signal LPF_OUT2 to the signal processor DSP. For example, the analog-to-digital converter ADC may convert the first output signal LPF_OUT1 into the first output value, convert the second output signal LPF_OUT2 into the second output value, and differentiate the first output value and the second output value to output the sensing value.

As described above with reference to FIG. 8, the analog front-end AFEn may remove noise (e.g. noise caused by the horizontal synchronization signal Hsync described with reference to FIG. 7A) from the n-th sensing signal RXn and the n+1-th sensing signal RXn+1 using the charge amplifier CA, the band pass filter BPF, the mixer MX, and the low pass filter LPF. Furthermore, the analog front-end AFEn may be embodied as the fully differential circuit (or fully differential analog front-end) that maintains and outputs two differential signals from the charge amplifier CA to the front-end of the analog-to-digital converter ADC (i.e. low pass filter LPF). The analog front-end AFEn provides two differential signals to the analog-to-digital converter ADC, thus increasing the dynamic range of the analog-to-digital converter or the available range of the dynamic range twofold, and enhancing the touch sensing sensitivity.

Figure 10:
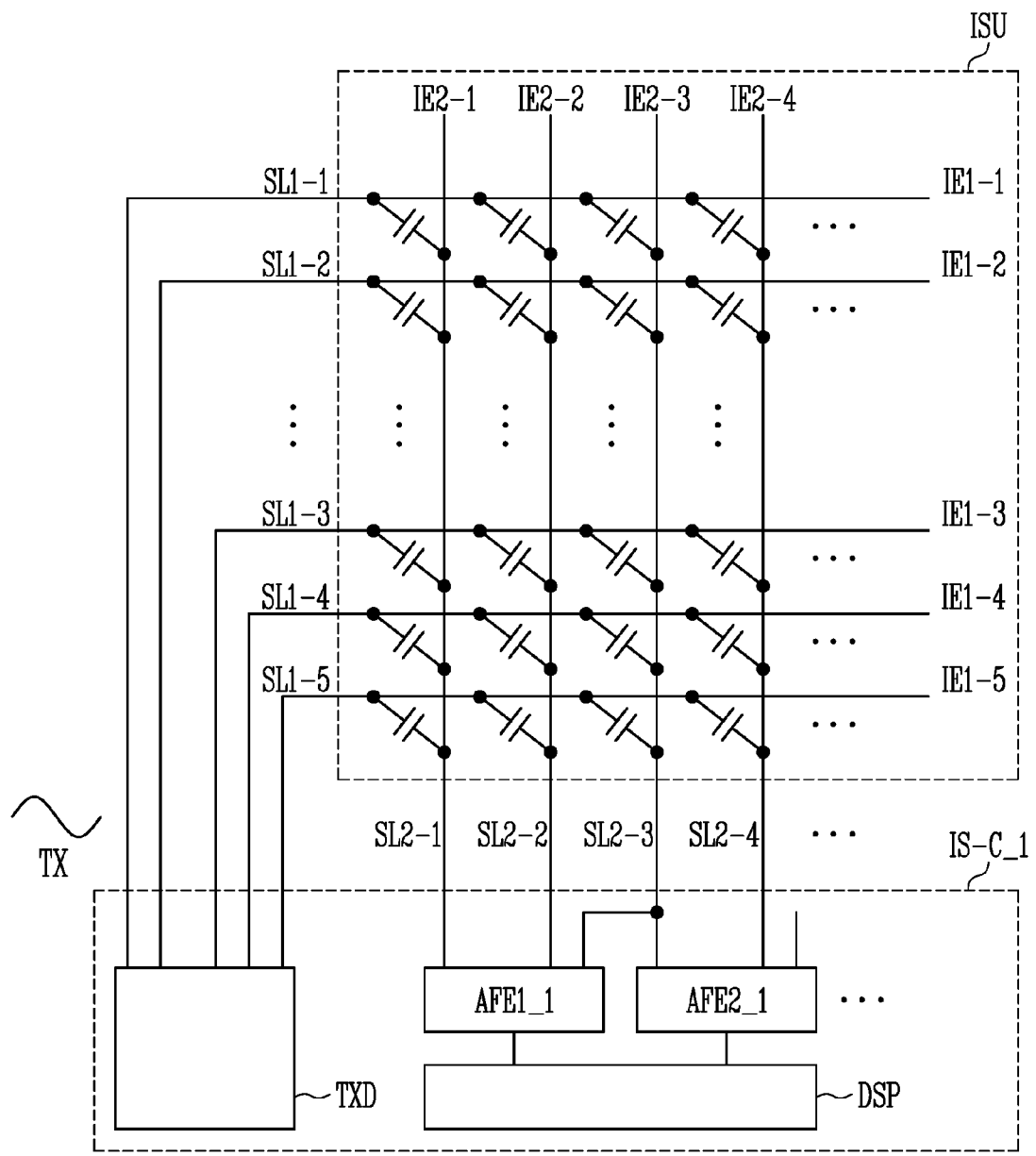
FIG. 10 is a circuit diagram illustrating an example of the input sensing unit and the input sensing circuit included in the display device of FIG. 1.

FIG. 10 is a circuit diagram illustrating an example of the input sensing unit and the input sensing circuit included in the display device of FIG. 1.

Referring to FIGS. 6A and 10, the input sensing circuit IS-C_1 is different from the input sensing circuit IS-C of FIG. 6A in that the input sensing circuit IS-C_1 includes analog front-ends AFE1_1 and AFE2_1. Since the input sensing circuit IS-C_1 is similar to the input sensing circuit IS-C of FIG. 6A except for the analog front-ends AFE1_1 and AFE2_1, a duplicated description thereof will be omitted herein.

Each of the analog front-ends AFE1_1 and AFE2_1 may be coupled to three adjacent sensing electrodes (or second signal lines) among the sensing electrodes IE2-1 to IE2-4, select two sensing electrodes among the three sensing electrodes, and output a sensing value corresponding to a difference between sensing capacitances corresponding to the two selected sensing electrodes. For example, the first analog front-end AFE1_1 may be coupled to the first sensing electrode IE2-1 located on the first place, the second sensing electrode IE2-2 located on the second place, and the third sensing electrode IE2-3 located on the third place, output a first sensing value corresponding to a difference between the sensing capacitance formed on the first sensing electrode IE2-1 located on the first place and the sensing capacitance formed on the second sensing electrode IE2-2 located on the second place in the first period, and output a second sensing value corresponding to a difference between the sensing capacitance formed on the second sensing electrode IE2-2 located on the second place and the sensing capacitance formed on the third sensing electrode IE2-3 located on the third place in the second period (i.e. the second period different from the first period).

Likewise, the second analog front-end AFE2_1 may be coupled to a third sensing electrode IE2-3 located on the third place (or third sensing electrode), a fourth sensing electrode IE2-4 located on the fourth place (or fourth sensing electrode), and a sensing electrode (not shown) located on the fifth place (or fifth sensing electrode), output a third sensing value corresponding to a difference between the sensing capacitance formed on the third sensing electrode IE2-3 located on the third place and the sensing capacitance formed on the fourth sensing electrode IE2-4 located on the fourth place in the first period, and output a fourth sensing value corresponding to a difference between the sensing capacitance formed on the fourth sensing electrode IE2-4 located on the fourth place and the sensing capacitance formed on a sensing electrode (not shown) located on the fifth place in the second period.

That is, the analog front-ends AFE1_1 and AFE2_1 may be coupled to the three sensing electrodes to sequentially output sensing values through time division driving. As compared to the input sensing circuit IS-C of FIG. 6A, the number of the analog front-ends AFE1_1 and AFE2_1 in the input sensing circuit IS-C_1 may be reduced.

Figure 11:
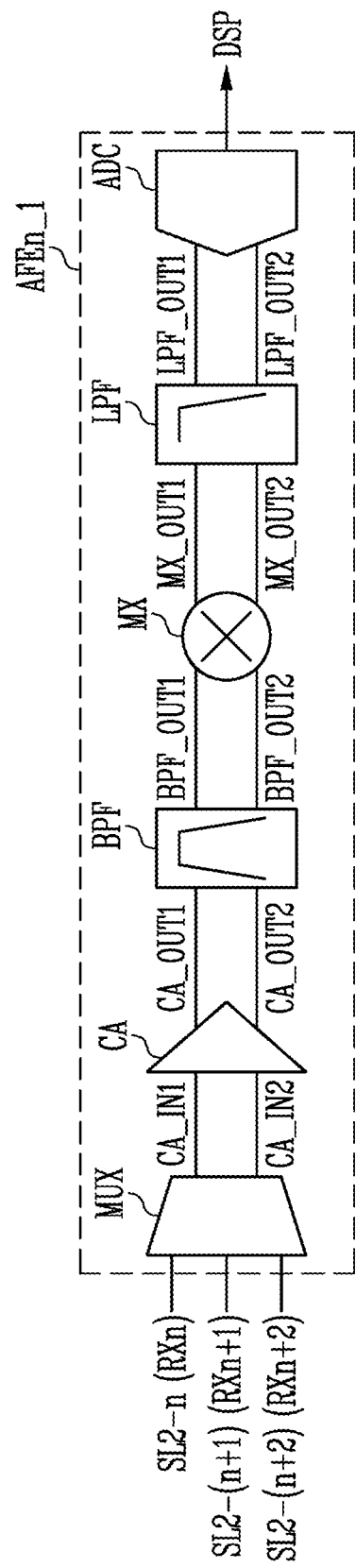
FIG. 11 is a block diagram illustrating an example of an analog front-end included in the input sensing circuit of FIG. 10.

FIG. 11 is a block diagram illustrating an example of an analog front-end included in the input sensing circuit of FIG. 10.

Referring to FIGS. 10 and 11, since the analog front-ends AFE1_1 and AFE2_1 are equal to each other, the analog front-end AFEn_1 as an example of the analog front-ends AFE1_1 and AFE2_1 will be collectively described.

The analog front-end AFEn_1 is different from the analog front-end AFEn of FIG. 8 in that the analog front-end AFEn_1 further includes a multiplexer MUX. Since the analog front-end AFEn_1 is substantially equal or similar to the analog front-end AFEn of FIG. 8 except for the multiplexer MUX, a duplicated description thereof will not be repeated therein.

The multiplexer MUX may receive the n-th sensing signal RXn provided through the second signal line SL2-n located on the n-th place (or the n-th sensing line), the n+1-th sensing signal RXn+1 provided through the second signal line SL2-(n+1) located on the n+1-th place (or the n+1-th sensing line), and the n+2-th sensing signal RXn+2 provided through the second signal line SL2-(n+2) located on the n+2-th place (or the n+2-th sensing line), and select two sensing signals among the n-th sensing signal RXn, the n+1-th sensing signal RXn+1, and the n+2-th sensing signal RXn+2 to output the sensing signals. Among the n-th sensing signal RXn, the n+1-th sensing signal RXn+1, and the n+2-th sensing signal RXn+2, two sensing signals may be provided to the charge amplifier CA as input signals CA_IN1 and CA_IN2. The multiplexer MUX may be embodied as a multiplexer having an input/output ratio of 3:2.

The operation of the multiplexer MUX will be described with reference to FIG. 12.

FIG. 12 is a diagram illustrating an operation of a multiplexer included in the analog front-end of FIG. 11. FIG. 12 illustrates a first multiplexer MUX1 and a second multiplexer MUX2 included in the analog front-ends AFE1_1 and AFE2_1 of FIG. 10.

In CASE1 (or first period), a first selection signal SEL1 may be provided to the first multiplexer MUX1 and the second multiplexer MUX2. The first selection signal SEL1 may be provided from the external device (e.g. signal processor DSP, driving signal generator TXD).

The first multiplexer MUX1 may couple the second signal line SL2-1 located on the first place (or the first sensing line) and the second signal line SL2-2 located on the second place (or the second sensing line) to a first channel CH1 and a second channel CH2, respectively, in response to the first selection signal SEL1. Here, the first channel CH1 and the second channel CH2 may correspond to input terminals of the charge amplifier CA (see FIG. 11), respectively, or may be coupled to the input terminals. Thus, the first sensing signal RX1 may be provided through the second signal line SL2-1 located on the first place to the first channel CH1, and the second sensing signal RX2 may be provided through the second signal line SL2-2 located on the second place to the second channel CH2. In this case, the first analog front-end AFE1_1 (see FIG. 10) including the first multiplexer MUX1 may output the first sensing value corresponding to a difference between the first sensing signal RX1 and the second sensing signal RX2.

Likewise, the second multiplexer MUX2 may couple the second signal line SL2-3 located on the third place (or the third sensing line) and the second signal line SL2-4 located on the fourth place (or the fourth sensing line) to a third channel CH3 and a fourth channel CH4, respectively, in response to the first selection signal SEL1. Here, the third channel CH3 and the fourth channel CH4 may correspond to input terminals of the charge amplifier CA (see FIG. 11), respectively, or may be coupled to the input terminals. Thus, the third sensing signal RX3 may be provided through the second signal line SL2-3 located on the third place to the third channel CH3, and the fourth sensing signal RX4 may be provided through the second signal line SL2-4 located on the fourth place to the fourth channel CH4. In this case, the second analog front-end AFE2_1 (see FIG. 10) including the second multiplexer MUX2 may output the third sensing value corresponding to a difference between the third sensing signal RX3 and the fourth sensing signal RX4.

That is, in CASE1 (or the first period), the analog front-ends AFE1_1 and AFE2_1 may output odd-numbered sensing values.

In CASE2 (or the second period), the second selection signal SEL2 may be provided to the first multiplexer MUX1 and the second multiplexer MUX2.

The first multiplexer MUX1 may couple the second signal line SL2-2 located on the second place and the second signal line SL2-3 located on the third place to the first channel CH1 and the second channel CH2, respectively, in response to the second selection signal SEL2. Thus, the second sensing signal RX2 may be provided through the second signal line SL2-2 located on the second place to the first channel CH1, and the third sensing signal RX3 may be provided through the second signal line SL2-3 located on the third place to the second channel CH2. In this case, the first analog front-end AFE1_1 (see FIG. 10) including the first multiplexer MUX1 may output the second sensing value corresponding to a difference between the second sensing signal RX2 and the third sensing signal RX3.

Likewise, the second multiplexer MUX2 may couple the second signal line SL2-4 located on the fourth place and the second signal line SL2-5 located on the fifth place (or the fifth sensing line) to the third channel CH3 and the fourth channel CH4, respectively, in response to the second selection signal SEL2. Thus, the fourth sensing signal RX4 may be provided through the second signal line SL2-4 located on the fourth place to the third channel CH3, and the fifth sensing signal RX5 may be provided through the second signal line SL2-5 located on the fifth place to the fourth channel CH4. In this case, the second analog front-end AFE2_1 (see FIG. 10) including the second multiplexer MUX2 may output the fourth sensing value corresponding to a difference between the fourth sensing signal RX4 and the fifth sensing signal RX5.

That is, in CASE2 (or the second period), the analog front-ends AFE1_1 and AFE2_1 may output even-numbered sensing values.

As described above with reference to FIGS. 11 and 12, the analog front-end AFEn_1 may include the multiplexer having the input/output ratio of 3:2, and output sensing values through time division driving. Thus, the number of the analog front-ends AFE1_1 and AFE2_1 in the input sensing circuit IS-C_1 (see FIG. 10) may be reduced, and the integration of the input sensing circuit IS-C_1 may be further facilitated.

Figure 13:
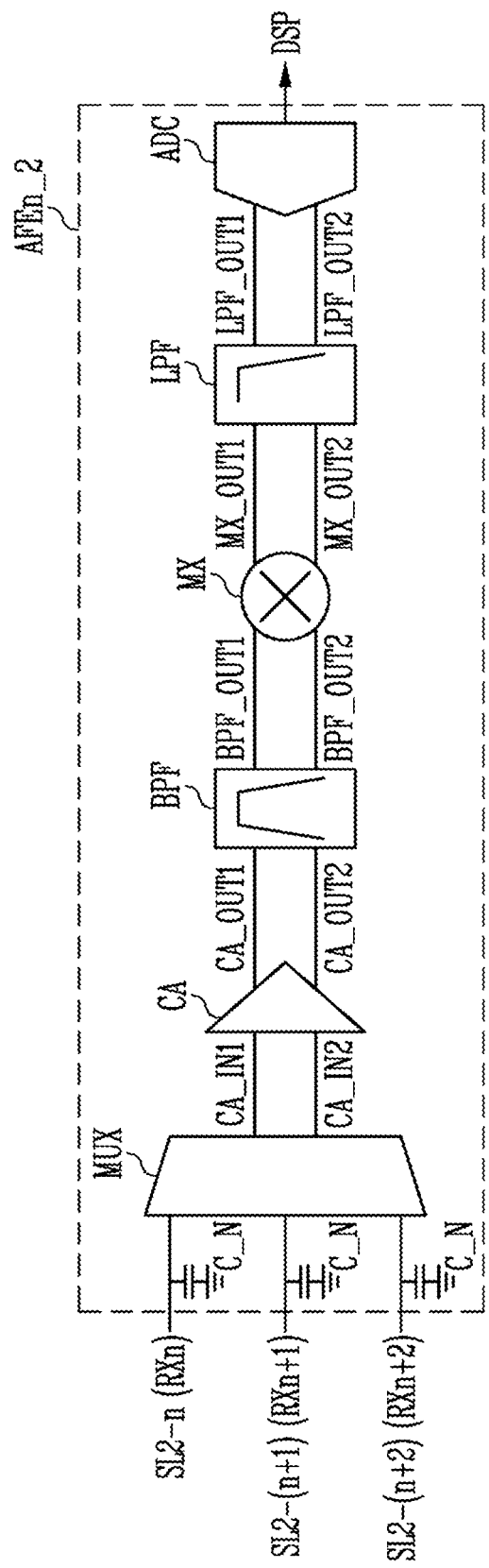
FIG. 13 is a block diagram illustrating an example of an analog front-end included in the input sensing circuit of FIG. 10.

FIG. 13 is a block diagram illustrating an example of an analog front-end included in the input sensing circuit of FIG. 10.

Referring to FIGS. 10, 11, and 13, the analog front-end AFEn_2 is different from the analog front-end AFEn_1 of FIG. 11 in that the analog front-end AFEn_2 further includes a negative capacitor C_N. Since the analog front-end AFEn_2 is substantially equal or similar to the analog front-end AFEn_1 of FIG. 11 except for the negative capacitor C_N, a duplicated description thereof will not be repeated therein.

The negative capacitor C_N (or negative capacitor circuit, parasitic capacitance compensation circuit) may be coupled to the input terminals of the multiplexer MUX, respectively, or be formed on each of the second signal lines.

For example, the negative capacitor C_N may be coupled to an input terminal of the multiplexer MUX located on the first place or the second signal line SL2-$n$ (or n-th sensing line) located on the n-th place. Furthermore, the negative capacitor C_N may be coupled to an input terminal of the multiplexer MUX located on the second place (or second signal line SL2-($n$+1) located on the n+1-th place, n+1-th sensing line) and an input terminal of the multiplexer MUX located on the third place (or second signal line SL2-($n$+2) located on the n+2-th place, n+2-th sensing line), respectively.

For reference, as described above with reference to FIG. 5, as the thickness T1 of the thin-film encapsulation layer TFE (or encapsulation organic layer OL) is reduced, a distance between each of electrodes in the input sensing unit ISU and the second electrode CE (or common electrode) of the light-emitting element OLED may be reduced, and parasitic capacitance formed therebetween may be increased. Furthermore, as the area of the display device is increased, an overlap area between each of the electrodes in the input sensing unit ISU and the second electrode CE of the light-emitting element OLED may be increased, and parasitic capacitance may be increased. The parasitic capacitance may cause the response delay of the touch driving signal and the sensing signal, and deteriorate the touch sensing sensitivity.

The negative capacitor C_N may be embodied as the negative capacitor field effect transistor (FET). When the voltage of a corresponding line is increased, the negative capacitor may be discharged. On the other hand, when the voltage of the corresponding line is reduced, the negative capacitor may be charged. Thereby, the negative capacitor C_N may offset the parasitic capacitance.

As described above with reference to FIG. 13, the analog front-end AFEn_2 may reduce the parasitic capacitance for the electrodes in the input sensing unit ISU using the negative capacitor C_N. Thus, the touch sensing sensitivity can be enhanced.

Figure 14:
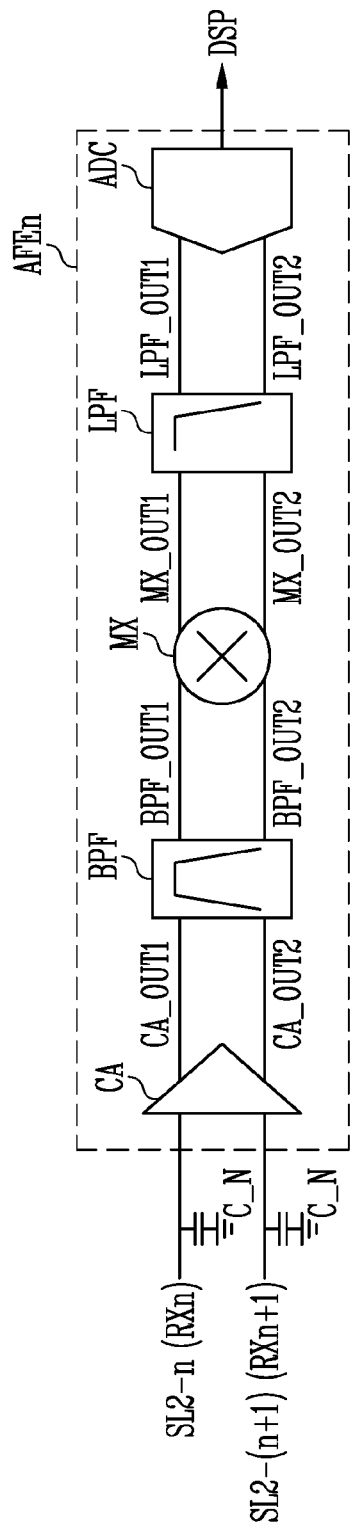
FIG. 14 is a block diagram illustrating an example of the analog front-end included in the input sensing circuit of FIG. 6A.

Meanwhile, although FIG. 13 illustrates that the analog front-end AFEn_2 includes the multiplexer MUX, the present disclosure is not limited thereto. FIG. 14 is a block diagram illustrating an example of the analog front-end included in the input sensing circuit of FIG. 6A. As illustrated in FIG. 14, the negative capacitor C_N may be applied to the analog front-end AFEn described with reference to FIG. 8.

An input sensing device and a display device in accordance with embodiments of the present invention may include an input sensing unit and an input sensing circuit. The input sensing circuit may differentially amplify adjacent sensing signals and remove noise (e.g. noise caused by a horizontal synchronization signal), using a fully differential analog front-end. Therefore, a frequency of a touch driving signal can be freely set regardless of a frequency of the horizontal synchronization signal, a reduction in bandwidth of the touch driving signal can be prevented, a dynamic range of a sensing signal can be widened, and a reduction in touch sensing sensitivity can be prevented.

Furthermore, the input sensing device and the display device use a touch driving signal that is set to avoid a pulse of a vertical synchronization signal and has a sine wave, thus further improving touch sensing sensitivity, and reducing power consumption and noise (or effect of noise).

Moreover, the input sensing device and the display device can reduce parasitic capacitance for electrodes in an input sensing unit, using a negative capacitor coupled to input terminals of the fully differential analog front-end. Consequently, the touch sensing sensitivity may be further enhanced.

The scope of the present invention is not limited by detailed descriptions of the present specification, and should be defined by the accompanying claims. Furthermore, all changes or modifications of the present invention derived from the meanings and scope of the claims, and equivalents thereof should be construed as being included in the scope of the present invention.

What is claimed is:

1. A display device, comprising:
   a display panel including pixels that emit light on a frame basis;
   an input sensing unit including driving electrodes and sensing electrodes;
   a driving signal generator configured to provide driving signals to the driving electrodes;
   analog front-ends configured to receive sensing signals depending on the driving signals from the sensing electrodes; and
   a signal processor configured to detect touch input, based on differential output values of the analog front-ends,
   wherein:
   the driving signal generator provides the driving signals to the driving electrodes while avoiding a period in which a pulse of a vertical synchronization signal defining a start of the frame is generated;
   the driving signals are asynchronous with a horizontal synchronization signal;
   each of the driving signals has a sine wave shape, and has a reference value in the period in which the pulse of the vertical synchronization signal is generated;
   the horizontal synchronization signal defines a period in which a line image is output through pixels included in a same line among the pixels; and a period in which each of the driving signals having the sine wave shape overlaps a period in which a pulse of the horizontal synchronization signal is generated.

2. The display device according to claim 1, wherein the driving signal generator stops supply of the driving signals in the period in which the pulse of the vertical synchronization signal is generated.

3. The display device according to claim 1, wherein:
the driving signals are synchronized with the vertical synchronization signal; and
the driving signal generator simultaneously provides the driving signals to the driving electrodes.

4. The display device according to claim 1, wherein a cycle of the driving signals is different from a cycle of the horizontal synchronization signal.

5. The display device according to claim 1, wherein the period in which each of the driving signals has the sine wave shape overlaps a blank period in which no data signal is provided to the pixels, within one frame.

6. The display device according to claim 1, wherein a period in which each of the driving signals has the reference value coincides with the period in which the pulse of the vertical synchronization signal is generated.

7. The display device according to claim 1, wherein the driving signals have a square wave shape of a same phase, and a period in which a pulse of the driving signals is generated does not overlap the period in which the pulse of the vertical synchronization signal is generated.

8. The display device according to claim 7, wherein:
the period in which the pulse of the driving signals is generated partially overlaps a period in which a pulse of the horizontal synchronization signal is generated; and
the horizontal synchronization signal defines the period in which the line image is output through the pixels included in the same line among the pixels.

9. The display device according to claim 1, wherein each of the analog front-ends comprises:
a charge amplifier configured to output complementary first and second differential signals by differentially amplifying a first sensing signal and a second sensing signal that are provided from two adjacent sensing electrodes, respectively, among the sensing electrodes;
a band pass filter configured to output a first filtered signal and a second filtered signal by filtering the first differential signal and the second differential signal, respectively;
a mixer configured to output a first demodulated signal and a second demodulated signal by changing frequencies of the first filtered signal and the second filtered signal, respectively;
a low pass filter configured to output a first output signal and a second output signal by filtering noise from each of the first demodulated signal and the second demodulated signal; and
an analog-to-digital converter configured to output a differential output value corresponding to a difference between the first output signal and the second output signal.

10. The display device according to claim 9, wherein the charge amplifier is a fully differential amplifier.

11. The display device according to claim 10, wherein the charge amplifier is configured to output the first differential signal through a first output terminal by differentially amplifying the first sensing signal applied through a first input terminal and the second sensing signal applied through a second input terminal, and to output the second differential signal having a waveform in which a phase of the first differential signal is reversed through a second output terminal.

12. The display device according to claim 9, further comprising a distribution circuit disposed between at least some of the sensing electrodes and the analog front-ends, respectively, and providing each of the sensing signals provided from at least some of the sensing electrodes to two adjacent analog front-ends among the analog front-ends.

13. The display device according to claim 9, further comprising a negative capacitor coupled to each of the analog front-ends.

14. The display device according to claim 1, wherein each of the analog front-ends comprises:
a multiplexer configured to select two sensing signals among sensing signals provided from three adjacent sensing electrodes among the sensing electrodes;
a charge amplifier configured to output complementary first and second differential signals by differentially amplifying the two sensing signals selected from the sensing signals;
a band pass filter configured to output a first filtered signal and a second filtered signal by filtering the first differential signal and the second differential signal, respectively;
a mixer configured to output a first demodulated signal and a second demodulated signal by changing frequencies of the first filtered signal and the second filtered signal, respectively;
a low pass filter configured to output a first output signal and a second output signal by filtering noise from each of the first demodulated signal and the second demodulated signal; and
an analog-to-digital converter configured to output a differential output value corresponding to a difference between the first output signal and the second output signal.

15. The display device according to claim 14, wherein:
the multiplexer selects the first sensing signal and the second sensing signal among the sensing signals in a first period, and selects the second sensing signal and a third sensing signal among the sensing signals in a second period different from the first period; and
the first to third sensing signals are provided from the three sensing electrodes, respectively.

16. The display device according to claim 15, wherein each of the analog front-ends further comprises a negative capacitor coupled to each of input terminals of the multiplexer.

17. The display device according to claim 1, wherein the display panel comprises:
a base layer;
a light-emitting element formed on the base layer to constitute each of the pixels; and
a thin-film encapsulation layer configured to cover the light-emitting element,
wherein the input sensing unit is directly formed on the thin-film encapsulation layer.

18. The display device according to claim 17, wherein the input sensing unit comprises:
a first conductive layer formed on the thin-film encapsulation layer, and including a first pattern;
an insulating layer disposed on the first conductive layer; and
a second conductive layer disposed on the insulating layer, and including a second pattern, and wherein at least one of the driving electrodes and the sensing electrodes comprises the first pattern and the second pattern.

19. The display device according to claim 18, wherein each of the first pattern and the second pattern has a mesh structure.

20. An input sensing device, comprising:
an input sensing unit including driving electrodes and sensing electrodes;
a driving signal generator configured to provide driving signals to the driving electrodes;
analog front-ends configured to receive sensing signals depending on the driving signals from the sensing electrodes; and
a signal processor configured to detect touch input, based on differential output values of the analog front-ends, wherein:
each of the analog front-ends:
generates complementary first and second differential signals by differentially amplifying a first sensing signal and a second sensing signal that are provided from two sensing electrodes of the sensing electrodes;
extracts a first output signal and a second output signal that correspond to the touch input from the first and second differential signals; and
provides the first output signal and the second output signal to an analog-to-digital converter;
each of the driving signals has a sine wave shape, and has a reference value in the period in which a pulse of a vertical synchronization signal is generated;
the driving signals are asynchronous with a horizontal synchronization signal;
the horizontal synchronization signal defines a period in which a line image is output through pixels included in a same line among the pixels; and
a period in which each of the driving signals has the sine wave shape overlaps a period in which a pulse of the horizontal synchronization signal is generated.

21. The input sensing device according to claim 20, wherein:
each of the analog front-ends comprises a charge amplifier configured to output the first and second differential signals by differentially amplifying the first sensing signal and the second sensing signal; and
the charge amplifier is configured to output the first differential signal through a first output terminal by differentially amplifying the first sensing signal applied through a first input terminal and the second sensing signal applied through a second input terminal, and to output the second differential signal having a waveform in which a phase of the first differential signal is reversed through a second output terminal.

22. The input sensing device according to claim 21, wherein each of the analog front-ends further comprises:
a band pass filter configured to output a first filtered signal and a second filtered signal by filtering the first differential signal and the second differential signal, respectively;
a mixer configured to output a first demodulated signal and a second demodulated signal by changing frequencies of the first filtered signal and the second filtered signal, respectively; and
a low pass filter configured to output the first output signal and the second output signal by filtering noise from each of the first demodulated signal and the second demodulated signal.

23. The input sensing device according to claim 22, wherein each of the analog front-ends further comprises a multiplexer configured to select two sensing signals among sensing signals provided from three adjacent sensing electrodes among the sensing electrodes, and to provide the two selected sensing signals to the charge amplifier as the first sensing signal and the second sensing signal.

24. The input sensing device according to claim 23, wherein each of the analog front-ends further comprises a negative capacitor coupled to each of input terminals of the multiplexer.

* * * * *